(12) United States Patent
Nishimura

(10) Patent No.: US 11,545,460 B2
(45) Date of Patent: Jan. 3, 2023

(54) SEMICONDUCTOR DEVICE AND METHOD FOR MANUFACTURING SEMICONDUCTOR DEVICE HAVING FIRST AND SECOND WIRES IN DIFFERENT DIAMETER

(71) Applicant: Fuji Electric Co., Ltd., Kanagawa (JP)

(72) Inventor: Takeyoshi Nishimura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 219 days.

(21) Appl. No.: 17/108,486

(22) Filed: Dec. 1, 2020

(65) Prior Publication Data
US 2021/0217723 A1 Jul. 15, 2021

(30) Foreign Application Priority Data

Jan. 10, 2020 (JP) .............................. JP2020-003198

(51) Int. Cl.
*H01L 23/00* (2006.01)
(52) U.S. Cl.
CPC .............. *H01L 24/46* (2013.01); *H01L 24/05* (2013.01); *H01L 24/43* (2013.01)
(58) Field of Classification Search
CPC ......... H01L 24/42; H01L 24/43; H01L 24/46; H01L 24/49; H01L 29/0696; H01L 29/7395
USPC ....................................................... 257/784
See application file for complete search history.

(56) References Cited

U.S. PATENT DOCUMENTS

| 5,950,304 A | * | 9/1999 | Khandros | ........... H01L 23/3107 |
| | | | | 257/E21.606 |
| 2017/0200691 A1 | | 7/2017 | Fujino et al. | |

FOREIGN PATENT DOCUMENTS

| EP | 2590309 A1 | 5/2013 |
| JP | 2006-13022 A | 1/2006 |
| JP | 2009-171732 A | 7/2009 |
| JP | 2011-18841 A | 1/2011 |
| JP | 2013-4779 A | 1/2013 |
| JP | 2013-98425 A | 5/2013 |
| WO | 2016/063744 A1 | 4/2016 |

* cited by examiner

*Primary Examiner* — Hoai V Pham
(74) *Attorney, Agent, or Firm* — Chen Yoshimura LLP

(57) ABSTRACT

A semiconductor device includes a semiconductor element having a surface electrode layer; a first wire that is electrically connected to the first main surface of the surface electrode layer at a plurality of first connecting portions and is arranged in a first direction on the first main surface; and a second wire that is electrically connected to the first main surface of the surface electrode layer at a second connecting portion and is arranged in a second direction on the first main surface, wherein a second circle equivalent diameter, which is a diameter of a circle having a same cross-sectional area as the second wire, is larger than a first circle equivalent diameter, which is a diameter of a circle having a same cross-sectional area as the first wire.

11 Claims, 20 Drawing Sheets

SEMICONDUCTOR DEVICE AND METHOD FOR MANUFACTURING SEMICONDUCTOR DEVICE HAVING FIRST AND SECOND WIRES IN DIFFERENT DIAMETER

BACKGROUND OF THE INVENTION

Technical Field

The present invention relates to a semiconductor device and a method for manufacturing a semiconductor device.

Background Art

Conventionally, a technique for reducing the resistance value of the path of the current flowing through the surface electrode layer of the semiconductor element mounted on the semiconductor device has been proposed (see, for example, Patent Document 1). The smaller the resistance value of the path of the current flowing through the surface electrode layer of the semiconductor element, the more the power loss during the operation of the semiconductor device can be reduced.

The semiconductor device includes a semiconductor element, a surface electrode layer arranged on the surface of the semiconductor element, and a bonding wire connected to the surface electrode layer to electrically connect the semiconductor element to the outside. The elements constituting the on-resistance of the semiconductor device include the resistance of the semiconductor element, the resistance of the surface electrode layer, and the resistance of the bonding wire.

In order to reduce the resistance of the semiconductor element, miniaturized structures, trench gate structures, super junction structures, and the like have been proposed. By using these, the resistance of the semiconductor element can be reduced to ½ or less.

Since the resistance of the semiconductor element is reduced, the resistance of the surface electrode layer and the resistance of the bonding wire are becoming relatively large.

As a technique for reducing the resistance of the surface electrode layer, the thickness of the surface electrode layer may be increased. However, since the thickness of the surface electrode layer is limited by the specifications of the semiconductor device and the process capability of the manufacturing process, it is difficult to increase only the thickness of the surface electrode layer.

Further, as a technique for reducing the resistance of the bonding wire, the number of bonding wires may be increased or the diameter of the bonding wire may be increased.

However, increasing the number of bonding wires or increasing the diameter of the bonding wires requires changing the wiring pattern of the circuit board to which the bonding wires are connected or changing the structure of external terminals such as lead frames. Further, increasing the number of bonding wires or increasing the diameter of the bonding wires also requires changing the area of the semiconductor element.

RELATED ART DOCUMENT

Patent Document

Patent Document 1: Japanese Patent Application Laid-Open Publication No. 2011-18841

SUMMARY OF THE INVENTION

FIG. 1 is a diagram showing a conventional semiconductor device 100 including a bonding wire. FIG. 2 is a cross-sectional view taken along the line Z-Z of FIG. 1.

The semiconductor device 100 includes: a semiconductor element 110; a bonding wire 133; a bonding wire 136; a circuit board or lead frame (not shown) on which the back surface electrode layer of the semiconductor element 110 is mounted via a solder layer or a conductive adhesive material such as silver paste; and a circuit board wiring pattern in the circuit board or external terminals (not shown), such as or a lead frame.

The semiconductor element 110 has a drain electrode layer 119 (back surface electrode layer) on the lower surface, and a source electrode layer 120 and a gate electrode layer 121 on the upper surface.

The semiconductor element 110 has a drain layer 111, a drift layer 112, and a plurality of trenches 150 having a depth direction from the upper surface of the drift layer 112 toward the drain layer 111. The trench 150 is provided with a gate insulating film 115 and a gate electrode 114 embedded inside the trench 150 via the gate insulating film 115. A p-base region 113 shallower than the bottom surface of the trench 150 is provided between the adjacent trenches 150. The surface layer of the p-base region 113 is provided with source region 116 that is in contact with the gate electrode 114 via the gate insulating film 115. Further, a p++ contact region 117 is provided between the adjacent source regions 116.

The connecting portion 134 indicates a portion where the bonding wire 133 is bonded (contacted) to the source electrode layer 120. Further, the connecting portion 137 indicates a portion where the bonding wire 136 is bonded (contacted) to the gate electrode layer 121. The source electrode layer 120 corresponds to the surface electrode layer.

One end of the bonding wire 133 is electrically connected to the source electrode layer 120 at the connecting portion 134. The other end of the bonding wire 133 is bonded to a wiring pattern of a circuit board or an external terminal of a lead frame (not shown) on which the semiconductor element 110 is mounted, and the wiring pattern or the external terminal of the lead frame is electrically connected to the source electrode layer 120.

The gate electrode layer 121 is electrically connected to the gate electrodes 114 via a wiring layer (not shown). The upper parts of the gate electrode 114 and the gate insulating film 115 are covered with the interlayer insulating film 118.

One end of the bonding wire 136 is electrically connected to the gate electrode layer 121 at the connecting portion 137. The other end of the bonding wire 136 is bonded to another wiring pattern of the circuit board on which the semiconductor element 110 is mounted or another external terminal (not shown) such as a lead frame, and another wiring pattern of the circuit board or the external terminal of the lead frame is electrically connected to the gate electrode layer 121.

The semiconductor element 110 has a plurality of cells. C1, C2, C3, and C4 shown in FIG. 2 represent some cells of the semiconductor element 110. Each cell is defined between the centers of the adjacent trenches 150 in the width direction. For example, the cell C1 is located between the center in the width direction of the trench 150a and the center in the width direction of the trench 150b adjacent to the trench 150a, and the cell C2 is located between the center in the width direction of the trench 150b and the center in the width direction of the trench 150c.

Each cell C1, C2, C3, C4 shown in FIG. 2 has the same structure, but the position of the cell C4 with respect to the bonding wire 133 is farther than the position of the cell C1. In the example shown in FIG. 2, the distance between the end portion 134a of the connecting portion 134 of the bonding wire 133 and the cell C4 is four times the distance between the end portion 134a of the connecting portion 134 of the bonding wire 133 and the cell C1.

During operation of the semiconductor device 100, in each cell C1, C2, C3, C4, a voltage equal to or higher than the threshold value is applied to the gate electrode 114 via the bonding wire 136 and the gate electrode layer 121, so that current flows from the drain electrode layer 119 to the source region 116, and the current flows from the source region 116 to the bonding wire 133 via the source electrode layer 120.

Here, cell C1 and cell C4 will be described as an example. For the cells C1 and C4, the resistance r0 in the path through which the current flows from the drain electrode layer 119 to the source region 116 is the same.

On the other hand, the path length in the source electrode layer 120 in which the current flows from the source region 116 of the cell C4 to the end portion 134a of the connecting portion 134 of the bonding wire 133 is four times the path length in the source electrode layer 120 in which the current flows from the source region 116 of the cell C1 to the end portion 134a of the connecting portion 134 of the bonding wire 133.

Therefore, the resistance of the path through which the current flows from the source region 116 of the cell C4 to the end portion 134a of the connecting portion 134 of the bonding wire 133 via the source electrode layer 120 is four times (4×rs) the resistance rs of the path through which the current flows from the source region 116 of the cell C1 to the end portion 134a of the connecting portion 134 of the bonding wire 133 via the source electrode layer 120.

As described above, the resistances between the respective cells C1, C2, C3, and C4 and the bonding wire 133 differ from each other depending on the respective distances between the cells C1, C2, C3, and C4 and the end portion 134a of the connecting portion 134 of the bonding wire 133.

Since the thickness of the source electrode layer 120 is about several μm, the sheet resistance of the source electrode layer 120 is not small. The sheet resistance of the source electrode layer 120 increases according to the distance of the source electrode layer 120 between each cell C1, C2, C3, C4 and the end portion 134a of the connecting portion 134 of the bonding wire 133. Therefore, the increase in the sheet resistance of the source electrode layer 120 increases the resistance of the surface electrode layer of the semiconductor element 110, which hinders the reduction of the on-resistance of the semiconductor device 100.

By the way, it has been proposed to use a copper clip instead of the bonding wire. FIG. 3 shows a conventional semiconductor device using a copper clip.

The semiconductor device 100 includes a semiconductor element 110, a solder layer 152, a copper clip 160, and a circuit board or a lead frame (not shown).

The semiconductor element 110 has a drain electrode layer 119 on the lower surface, a source electrode layer 120 on the upper surface, and a gate electrode layer 121 on the upper surface. Further, a plating layer 151 is provided on the upper surface of the source electrode layer 120. Another plating layer, another solder layer, and another copper clip (not shown) are also provided on the upper surface of the gate electrode layer 121.

The semiconductor element 110 has a drain layer 111, a drift layer 112, and a plurality of trenches 150 having a depth direction from the upper surface of the drift layer 112 toward the drain layer 111. The trench 150 is provided with the gate insulating film 115 and a gate electrode 114 embedded inside the trench 150 via the gate insulating film 115. A p-base region 113 shallower than the bottom surface of the trench 150 is provided between the adjacent trenches 150. The surface layer of the p-base region 113 is provided with the source region 116 that is in contact with the gate electrode 114 via the gate insulating film 115. The upper parts of the gate electrode 114 and the gate insulating film 115 are covered with the interlayer insulating film 118.

Further, a p++ contact region 117 is provided between the adjacent source areas 116. Here, the surface electrode layer of the semiconductor element 110 refers to the source electrode layer 120 and the plated electrode layer 151.

The copper clip 160 electrically connects the source electrode layer 120 and a plated electrode layer 151, which are surface electrode layers, and a wiring pattern of a circuit board or an external terminal (not shown) such as a lead frame on which a semiconductor element 110 is mounted via a solder layer 152.

The semiconductor element 110 has a plurality of cells. C1, C2, C3, and C4 shown in FIG. 3 indicate some of these cells of the semiconductor element 110. Each cell is defined between the centers of adjacent trenches 150 in the width direction. For example, the cell C1 is located between the center in the width direction of the trench 150a and the center in the width direction of the trench 150b adjacent to the trench 150a, and the cell C2 is located between the center in the width direction of the trench 150b and the center in the width direction of the trench 150c adjacent to the trench 150b.

During operation of the semiconductor device 100, in each cell C1, C2, C3, and C4, a voltage equal to or higher than the threshold value is applied to the gate electrodes 114, so that a current flows from the drain electrode layer 119 to the source region 116 and the current flows from the source region 116 to the copper clip 160 through the source electrode layer 120, the plated electrode layer 151, and the solder layer 152.

The copper clip 160 is electrically connected to the source electrode layer 120 in a planar manner via the solder layer 152. Therefore, the path length of the current flowing from the source region 116 of the cell C4 to the copper clip 160 through the solder layer 152 of the source electrode layer 120 which is the surface electrode layer is the same as the path length of the cell C1.

That is, the resistance of the path through which the current flows from the source region 116 of the cells C1 and C4 to the copper clip 160 is the sum of the resistance component r1 of the source electrode layer 120, the resistance component r2 of the plated electrode layer 151, and the resistance component r3 of the solder layer 152.

However, since the resistance of the plated electrode layer 151 and the solder layer 152 is large, the resistance of the path through which the current flows through the source electrode layer 120, the plated electrode layer 151, and the solder layer 152 is about two orders of magnitude higher than the case of having only source electrode layer 120 as the surface electrode layer shown in FIG. 2. Therefore, the on-resistance of the semiconductor device 100 having the copper clip 160 is higher than when the bonding wire is used.

Therefore, it is difficult to reduce the on-resistance of the semiconductor element 110 by reducing the resistances of the source electrode layer 120, the plated electrode layer 151, and the solder layer 152, which correspond to the surface electrode of the semiconductor element 110, instead of using the bonding wire.

The present specification aims at providing a semiconductor element having a low on-resistance by reducing the resistance of the path through which the current flows in the surface electrode layer of the semiconductor element and a method of manufacturing such a semiconductor element.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: a semiconductor element having a surface electrode layer, the surface electrode layer having a first main surface and a second main surface opposite to the first main surface, the first main surface being an exposed surface; a first wire that is electrically connected to the first main surface of the surface electrode layer at a plurality of first connecting portions and is arranged in a first direction on the first main surface; and a second wire that is electrically connected to the first main surface of the surface electrode layer at a second connecting portion and is arranged in a second direction on the first main surface, wherein a second circle equivalent diameter, which is a diameter of a circle having a same cross-sectional area as the second wire, is larger than a first circle equivalent diameter, which is a diameter of a circle having a same cross-sectional area as the first wire.

In the above-described semiconductor device, the first circle-equivalent diameter may be 4 times or more and 50 times or less a thickness of the surface electrode layer.

In the above-described semiconductor device, the first direction may intersect with the second direction.

In the above-described semiconductor device, the first direction and the second direction may be parallel to each other.

In the above-described semiconductor device, the first wire and the second wire may be in contact with each other.

In the above-described semiconductor device, the first connecting portion of the first wire that is closest to the second connecting portion of the second wire may be separated from the second connecting portion by a distance S, and a sheet resistance Rs of an annular region of the surface electrode layer that surrounds every side of the first connecting portion that is closest to the second connection portion by the distance S in a plan view may satisfy 0≤Rs/Rc≤0.2, where Rc is an on-resistance of the semiconductor element corresponding to said annular region as well as the first connecting portion closest to the second connection portion in the plan view.

In another aspect, the present disclosure provides a method for manufacturing a semiconductor device including a semiconductor element having a surface electrode layer, the surface electrode layer having a first main surface and a second main surface opposite to the first main surface, the first main surface being an exposed surface, the method comprising: a first step of arranging a first wire having conductivity on the first main surface of the surface electrode layer so as to be electrically connected to the first main surface of the surface electrode layer at a plurality of first connecting portions and so as to be arranged in a first direction; and a second step of arranging a second wire having conductivity on the first main surface of the surface electrode layer so as to be electrically connected to the first main surface of the surface electrode layer at a second connecting portion and so as to be arranged in a second direction, the second wire having a larger cross section than the first wire.

In the above-described method, the second step may be performed after the first step.

In the above-described method, the second direction may intersect with the first direction intersect.

In the above-described method, the second direction and the first direction may be parallel to each other.

In the above-described method, the second step may cause the second wire to be in contact with the first wire.

According to the semiconductor device disclosed in the present specification described above, the resistance of the path of the current flowing through the surface electrode layer of the semiconductor device is reduced so as to reduce the on-resistance of the semiconductor device.

Further, according to the method for manufacturing a semiconductor device disclosed in the present specification described above, the resistance of the path of the current flowing through the surface electrode layer of the semiconductor element is reduced to obtain a semiconductor device having a low on-resistance.

It is to be understood that both the foregoing general description and the following detailed description are exemplary and explanatory, and are intended to provide further explanation of the invention as claimed.

DETAILED DESCRIPTION OF EMBODIMENTS

Hereinafter, embodiments of the semiconductor device disclosed in the present specification will be described with reference to the drawings. However, the technical scope of the present invention is not limited to those embodiments, but extends to the inventions described in the claims and their equivalents.

In the present specification, the layer or region marked with n means that the electrons are the majority carriers, and the layer or region marked with p means that the holes are the majority carriers. Further, + attached to n or p means that the impurity concentration is higher than that of the layer or region without it, and ⁻ attached to n or p means that the impurity concentration is lower than that of the layer or region without it.

Figure 1:
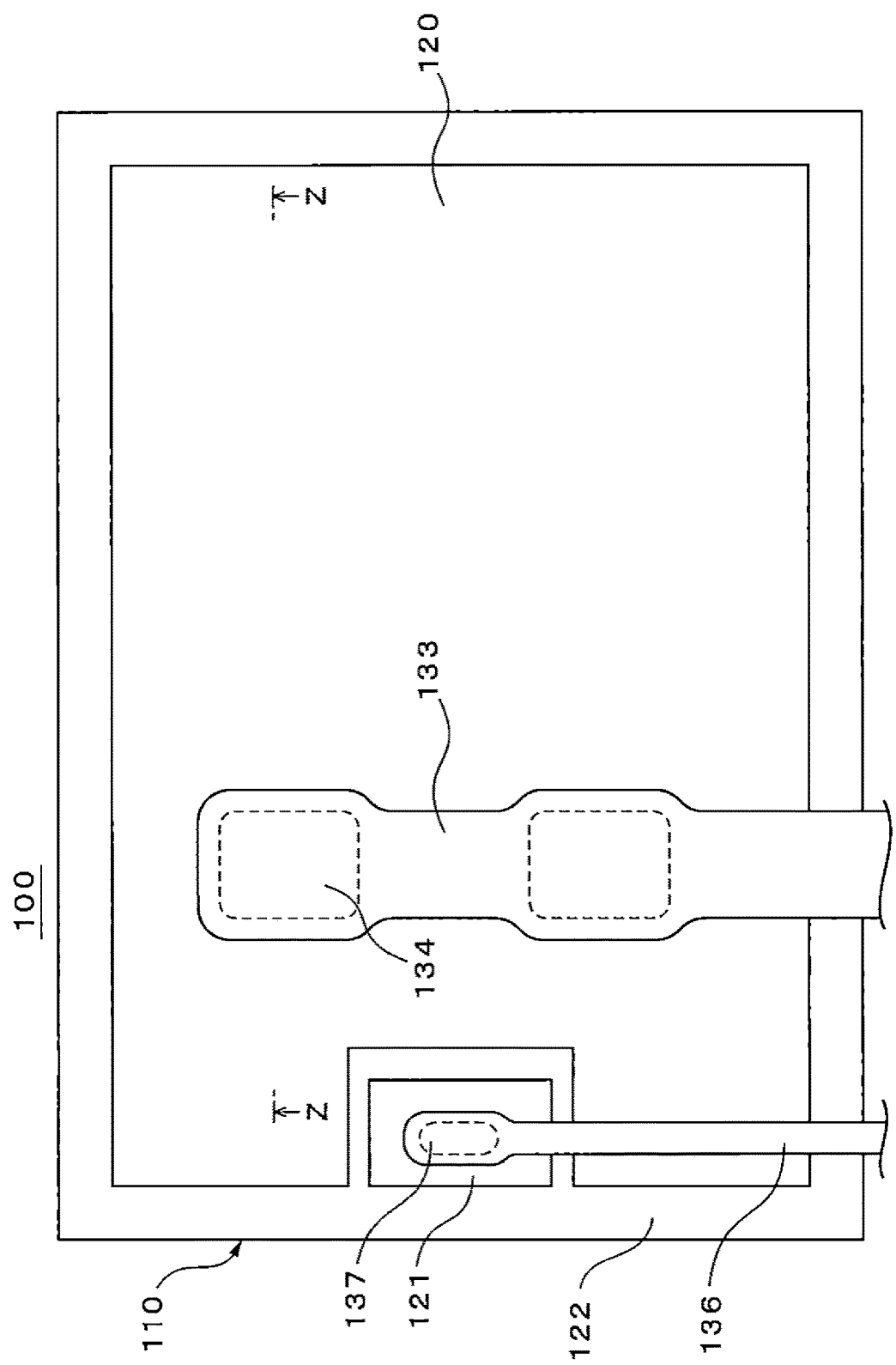
FIG. 1 is a plan view showing a conventional semiconductor device.
Figure 2:
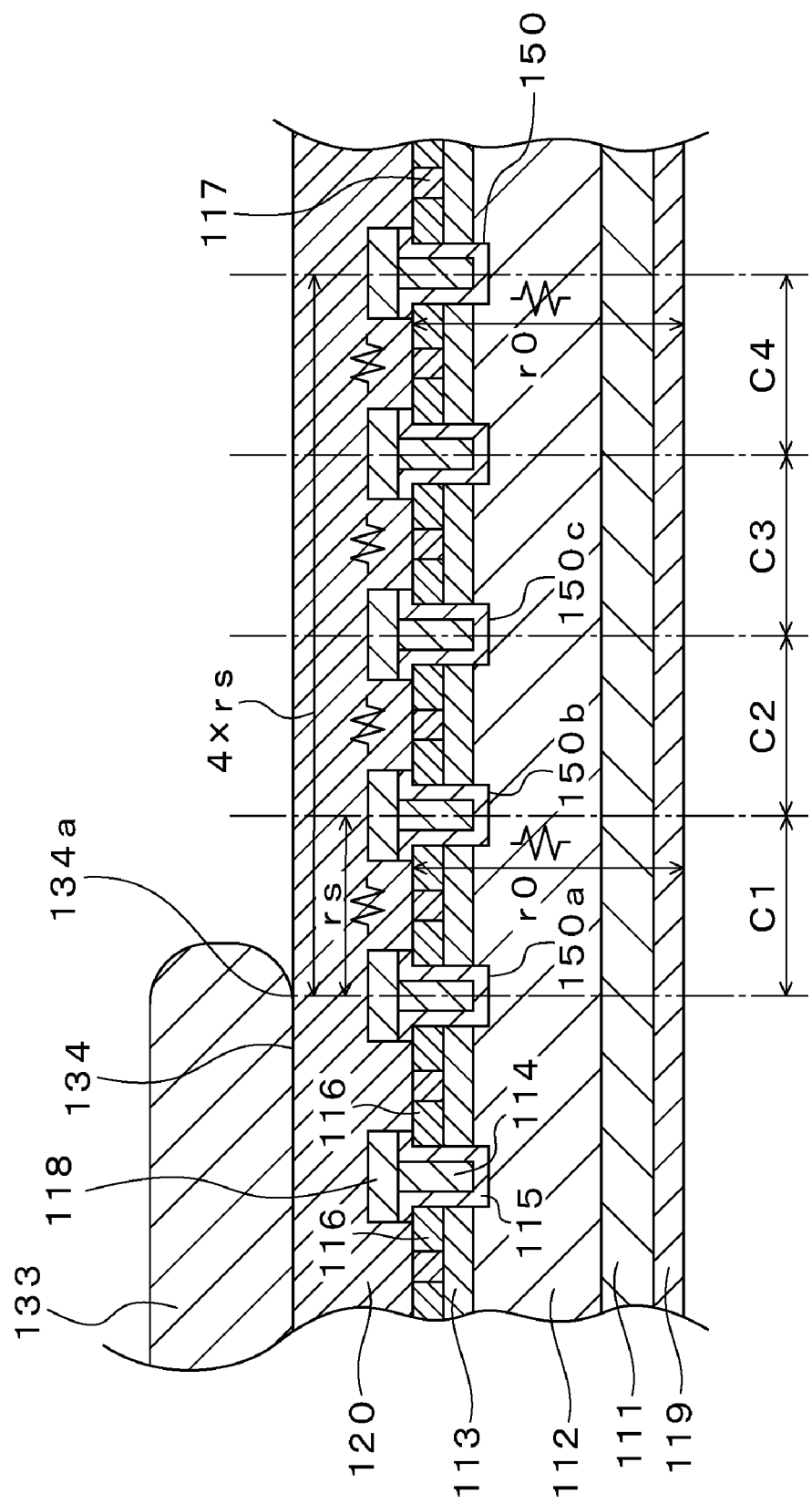
FIG. 2 is a cross-sectional view taken along the line Z-Z of FIG.
Figure 3:
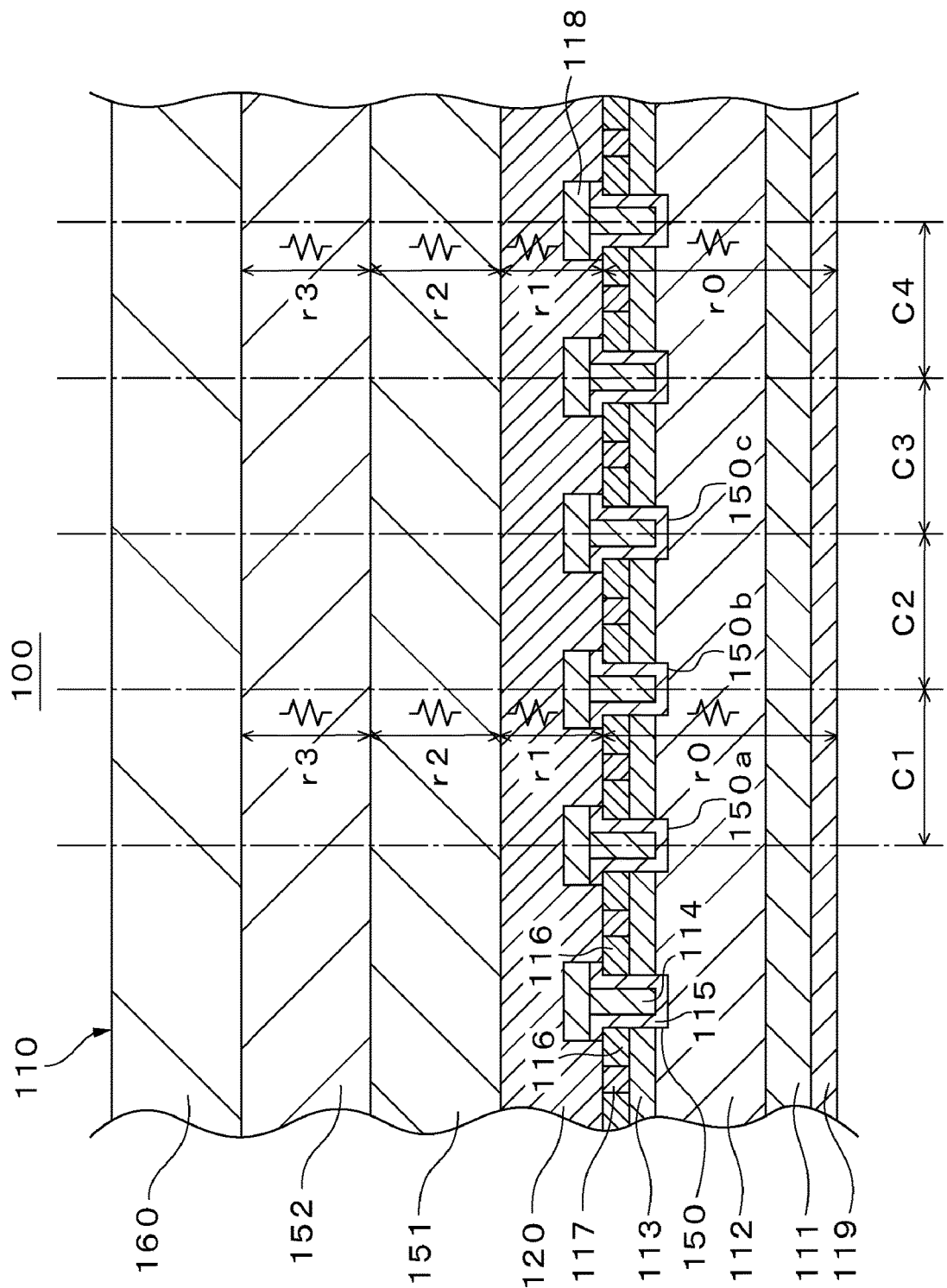
FIG. 3 is a cross-sectional view showing another semiconductor device of the conventional example.
Figure 4:
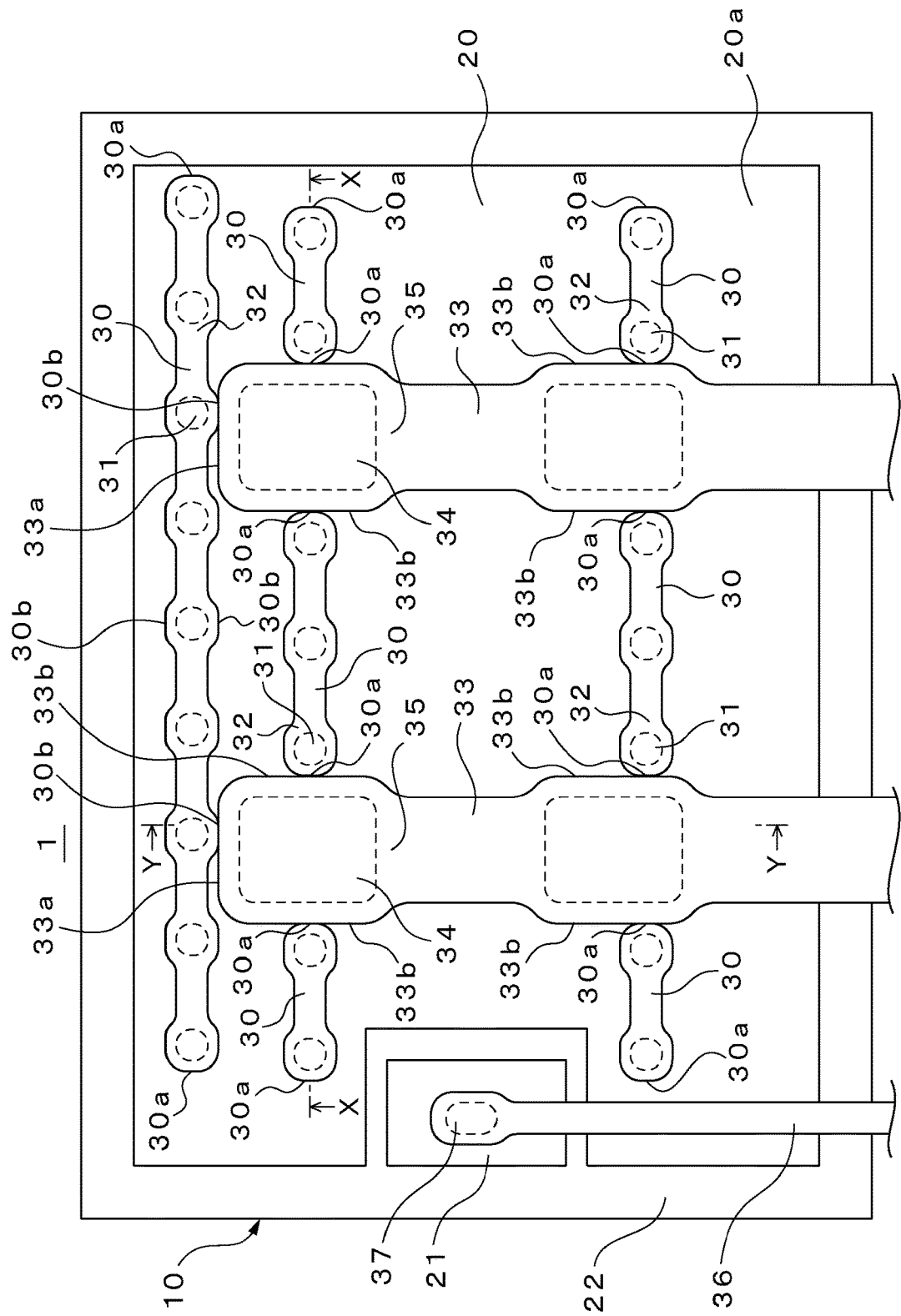
FIG. 4 is a plan view showing a semiconductor device according to a first embodiment of the present invention.
Figure 5:
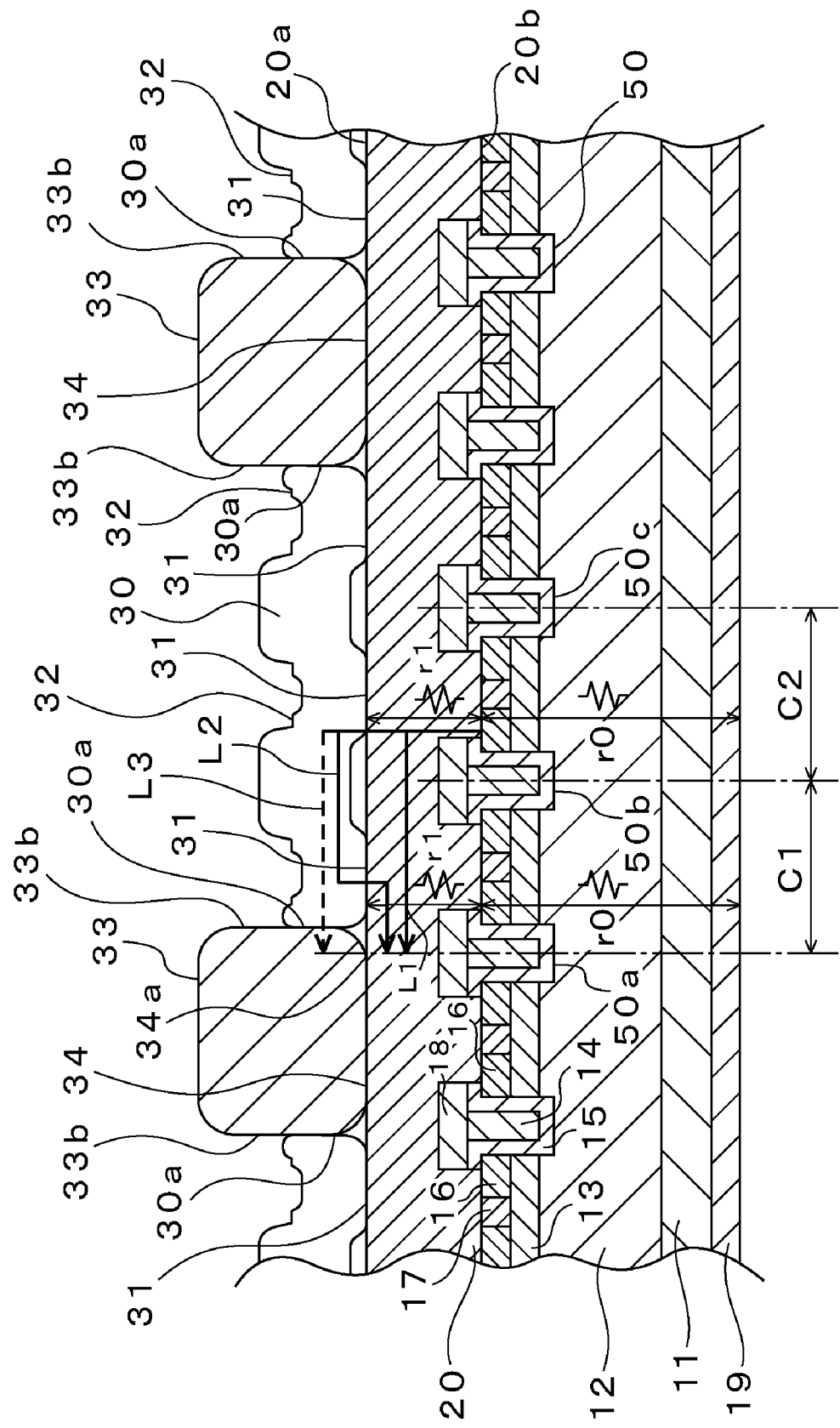
FIG. 5 is a cross-sectional view taken along the line X-X of FIG. 1.
Figure 6:
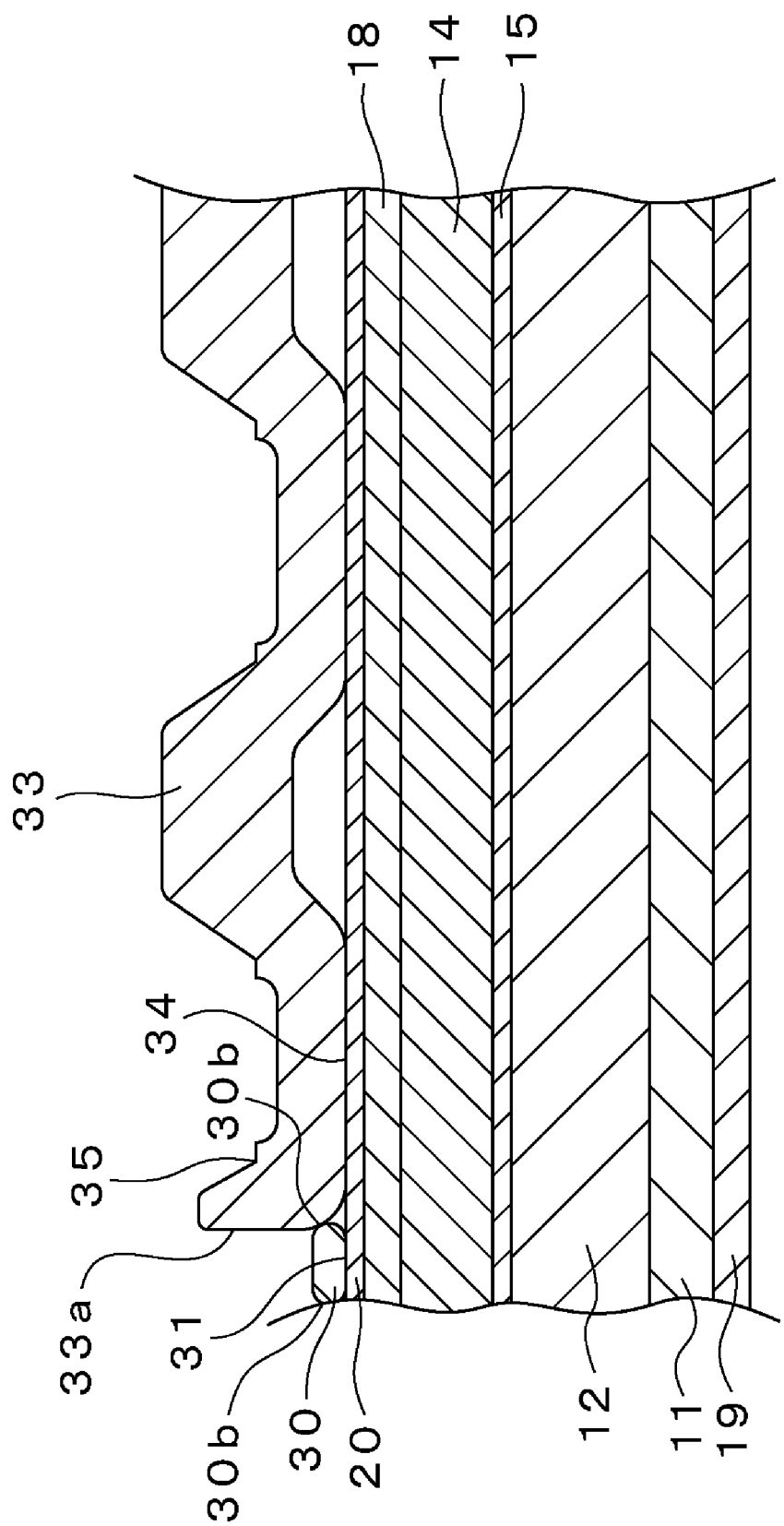
FIG. 6 is a cross-sectional view taken along the line Y-Y of FIG. 1.

FIG. 4 is a plan view showing a first embodiment of the present invention. FIG. 5 is a cross-sectional view taken along line the X-X of FIG. 1. FIG. 6 is a cross-sectional view taken along the line Y-Y of FIG. 1.

The semiconductor device 1 includes a semiconductor element 10, first wires 30, second wires 33, a third wire 36, and a circuit board or a lead frame (not shown) on which the back surface electrode layer (drain electrode layer 19) of the semiconductor element 10 is mounted via a conductive adhesive, such as a solder layer, a silver paste, or the like. As shown in FIG. 4, the semiconductor element 10 has a rectangular shape in a plan view.

Further, as shown in FIG. 5, the semiconductor element 10 has a plurality of cells. C1 and C2 shown in FIG. 5 indicate some of the plurality of cells of the semiconductor element 10. Each cell is defined between the centers of adjacent trenches 50 in the width direction. For example, the cell C1 is located between the center in the width direction of the trench 50a and the center in the width direction of the trench 50b adjacent to the trench 50a, and the cell C2 is located between the center in the width direction of the trench 50b and the center in the width direction of the trench 50c adjacent to the trench 50b.

The semiconductor element 10 of the present embodiment has a drain electrode layer 19 (back surface electrode layer) on the lower surface, and a source electrode layer 20 and a gate electrode layer 21 on the upper surface. A voltage withstand structure region 22 is provided on the outer periphery of the semiconductor element 10.

The drain electrode layer 19 is arranged so as to cover the entire back surface side of the semiconductor element 10. The n+ drain layer 11 is arranged on the drain electrode layer 19.

The n⁻ drift layer 12 is arranged on the n+ drain layer 11.

The semiconductor element 10 has a plurality of trenches 50 provided at predetermined intervals, with the direction from the upper surface of the n⁻ drift layer 12 toward the n+ drain layer 11 as the depth direction. The trench 50 is provided with a gate insulating film 15 and a gate electrode 14 embedded in the trench 50 via the gate insulating film 15.

The surface layer of the n⁻ drift layer 12 between adjacent trenches 50 is provided with a p base region 13 shallower in the depth direction than the bottom surface of the trench 50.

The surface layer of the p-base region 13 is provided with an n+ source region 16 that is in contact with the gate electrode 14 via the gate insulating film 15. A pair of the n+ source regions 16 is arranged so as to sandwich the trench including the gate electrode 14 and the gate insulating film 15.

Further, a p++ contact region 17 may be provided between adjacent n+ source regions 16.

The gate electrode 14 is electrically connected to the gate electrode layer 21 via a wiring layer (not shown). The interlayer insulating film 18 is arranged between the gate electrode 14 and the source electrode layer 20, and covers the upper parts of the gate electrode 14 and the gate insulating film 15.

The n+ drain layer 11, the n⁻ drift layer 12, the p⁻ base region 13, the n+ source region 16, and the p++ contact region 17 are formed by laminating layers having impurities that give p-type polarity (for example, boron or aluminum) or impurities that give n-type polarity (for example, phosphorus, arsenic, or antimony) to the silicon substrate, or by injecting these impurities into the silicon substrate or by laminating semiconductor layers having these impurities to the silicon substrate.

The source electrode layer 20 is an example of a surface electrode layer, and is arranged on the surface of the semiconductor element 10. In a plan view, the source electrode layer 20 has a cutout portion that is recessed inward, and the gate electrode layer 21 is arranged in the cutout portion. The source electrode layer 20 and the gate electrode layer 21 may be formed of aluminum, an aluminum alloy, copper, a copper alloy, other conductive metals, or a laminate thereof. A voltage withstand structure region 22 is arranged on the outer periphery of the semiconductor element 10.

The semiconductor element 10 has a plurality of cells. Cells C1 and cell C2 shown in FIG. 5 represent some of the plurality of cells of the semiconductor element 10. Each cell is defined between the centers of adjacent trenches 50 in the width direction. The width direction of the trench 50 indicates a direction orthogonal to the depth direction of the trench 50 from the upper surface of the n⁻ drift layer 12 toward the n+ drain layer 11. For example, the cell C1 is located between the center in the width direction of the trench 50a and the center in the width direction of the trench 50b adjacent to the trench 50a, and the cell C2 is located between the center in the width direction of the trench 50b and the center in the width direction of the trench 50c adjacent to the trench 50b.

Among the elements constituting the semiconductor device 1, the first wires 30, the second wires 33, the third wire 36, and the circuit board or lead frame (not shown) on which the semiconductor element 10 are mounted, the wiring pattern of the circuit board or an external terminal of the lead frame (not shown), and a conductive adhesive material, such as a solder layer or silver paste, used to mount the drain electrode layer 19 (back surface electrode layer) of a semiconductor element 10 on the circuit board or the lead frame are not included in the semiconductor element 10.

The source electrode layer 20 has a first main surface 20a and a second main surface 20b. The second main surface 20b is electrically connected to the cells C1 and C2. In the source electrode layer 20, the first main surface 20a is exposed to the outside as the upper surface of the semiconductor element 10. The first main surface 20a is exposed to the outside as the surface of the semiconductor element 10.

The first wire 30 has conductivity and is electrically connected to the first main surface 20a of the source electrode layer 20 by a plurality of connecting portions 31. The first wire 30 is arranged on the first main surface 20a in a predetermined direction. A plurality of first wires 30 are arranged on the first main surface 20a.

The first wire 30 is electrically connected only to the first main surface 20a of the source electrode layer 20, and is not connected to a wiring pattern of a circuit board or an external terminal (not shown) such as a lead frame.

The connecting portion 31 indicates a portion where the first wire 30 and the first main surface 20a of the source electrode layer 20 are joined. One first wire 30 has a plurality of connecting portions 31, and is electrically connected at a plurality of locations on the first main surface 20a of the source electrode layer 20. The plurality of connecting portions 31 are formed by joining a plurality of portions of the first wire 30 and the first main surface 20a of the source electrode layer 20 by using ultrasonic waves, for example, as in wire bonding. The portion of the first wire 30 between the two adjacent connecting portions 31 is not in contact with the first main surface 20a.

Adjacent connecting portions 31 are connected by the first wire 30. If the adjacent connecting portions 31 were not connected by the first wire 30, the sheet resistance of the source electrode layer 20 of the portion of the connecting portion 31 in which the first wire 30 is connected to the first main surface 20a of the source electrode layer 20 is reduced, but the sheet resistance of the source electrode layer 20 in the portion between the adjacent connecting portions 31 is higher than the sheet resistance of the source electrode layer 20 in the portion of the connecting portion 31. Therefore, in the connecting portion 31 away from the second wire 33, which will be described later, the resistance of the source electrode layer 20 between the connecting portion 31 and the second wire 33 becomes high, and the on-resistance of the semiconductor device 1 becomes high.

Therefore, by connecting the adjacent connecting portions 31 with the first wire 30, the resistance of the source electrode layer 20 between the second wire 33 and the connecting portion 31 separated from the second wire 33 can be reduced.

As a result, the same effect as increasing the thickness of the source electrode layer 20 and reducing the resistance of the path of the current flowing through the source electrode layer 20 can be obtained.

Further, the shorter the distance between the adjacent connecting portions 31, the smaller the resistance of the path of the current flowing through the source electrode layer 20.

Note that the space between the two connecting portions 31 of the first wire 30 may be in contact with the first main surface 20a of the source electrode layer 20.

The larger the area of the connecting portion 31 (the joining area between the first main surface 20a of the source electrode layer 20 and the first wire 30) where the first wire 30 and the first main surface 20a of the source electrode layer 20 are joined, the more the resistance of the path of the current flowing through the source electrode layer 20 becomes small.

Therefore, the area of one connecting portion 31 is increased, or a plurality of connecting portions 31 are provided to increase the joining area between the first wire 30 and the first main surface 20a. As a result, the resistance of the path of the current flowing through the source electrode layer 20 is reduced, and the on-resistance of the semiconductor device 1 can be reduced.

The first wire 30 has a connection peripheral portion 32 around the connecting portion 31. The connection peripheral portion 32 is provided in the direction in which a plurality of connecting portions 31 provided in one first wire 30 are lined up (direction in which the first wire 30 extends).

When the connecting portion 31 is formed by using ultrasonic waves as in wire bonding, for example, the connection peripheral portion 32 is a boundary portion between a crushed portion and a non-crushed portion in the first wire 30 when the connecting portion 31 is formed.

Note that the connection peripheral portion 32 does not have to be provided in the direction orthogonal to the direction in which the plurality of connecting portions 31 are lined up.

For example, when the connecting portion 31 is formed by using ultrasonic waves as in wire bonding, the upper parts of the connecting portion 31 of the first wire 30 in the direction orthogonal to the direction in which the plurality of connecting portions 31 are arranged may all be crushed by ultrasonic waves.

As shown in FIG. 4, the end portion 30a of the first wire 30 may be in contact with the side surface 33b of the second wire 33, which will be described later. The end portion 30a of the first wire 30 comes into contact with the side surface 33b of the second wire 33, so that the first wire 30 and the second wire 33 are electrically connected. As a result, the resistance of the current path flowing through the source electrode layer 20 can be further reduced, and the on-resistance of the semiconductor device 1 can be reduced.

The side surface 33b of the second wire 33 indicates the side surface of the connecting portion 34.

A plurality of first wires 30 are connected on the first main surface 20a of the source electrode layer 20 of the semiconductor element 10. Each of the plurality of first wires 30 has a plurality of connecting portions 31, and is electrically connected to the first main surface 20a of the source electrode layer 20.

The resistance of the first wire 30 itself should be small. Further, the larger the diameter of the first wire 30, the lower the resistance of the first wire 30. The shape of the cross section of the wire used as the material for forming the first wire 30 is usually circular, and the cross section is substantially constant in the longitudinal direction. As a material for forming the first wire 30, a conductive wire having a constant diameter and a circular cross-sectional shape is used.

When a ribbon type wire is used as the wire of the material forming the first wire 30, the cross-sectional shape of the wire is a shape other than a circle. Further, even if a wire having a circular cross section is used as the material, since the connecting portion 31 of the first wire 30 is formed by using ultrasonic waves as in wire bonding, for example, the shape of the cross section of the connecting portions 31 taken in the direction orthogonal to the direction in which a plurality of connecting portions 31 of the first wire 30 are arranged is not circular.

Therefore, when defining the relationship between the thickness of the first wire 30 and the thickness of the source electrode layer 20, the circle-equivalent diameter is used. The circle-equivalent diameter of the first wire 30 is obtained by converting the thickness of the cross section of the first wire into the diameter of a wire having the same cross-sectional area as the cross-sectional area of the first wire 30 that would have a circular cross-sectional shape. For example, the diameter converted to the diameter of a circular wire having the same cross section as the cross section of the connecting portion 31 of the first wire 30 may be regarded as a circle-converted diameter.

The circle-equivalent diameter of the first wire 30 may be 4 times or more the thickness of the source electrode layer 20, and may be 8 times or more.

The thickness of the source electrode layer 20 indicates the thickness from the upper surface of the n+ source region 16 to the upper surface (first main surface 20a) of the source electrode layer 20.

Since the circular equivalent diameter of the cross section of the first wire 30 is four times or more the thickness of the source electrode layer 20, the resistance of the first wire 30 electrically connected to the source electrode layer 20 at the connecting portion 31 is sufficiently lowered.

Further, since one first wire 30 has a plurality of connecting portions 31, the area (joining area) where the first wire 30 and the first main surface 20a of the source electrode layer 20 are joined becomes large. The larger the area (joint area) where the first wire 30 and the first main surface 20a of the source electrode layer 20 are joined, the lower the resistance between the first wire 30 and the source electrode layer 20 can be. Further, the semiconductor element 10 can further reduce the resistance between the first wire 30 and the source electrode layer 20 by providing a plurality of first wires 30 having a plurality of connecting portions 31.

The upper limit of the circle-equivalent diameter of the cross section of the first wire 30 may be 30 times or less or 50 times or less the thickness of the source electrode layer 20.

Here, in FIG. 5 and cross-sectional views described later, the thickness of the source electrode layer 20 is shown to be thicker than the actual thickness in order to make the structure of the semiconductor element 10 easy to understand.

The shape of the cross section of the first wire 30 corresponds to the shape of the cross section of the wire used as the material. Because the connecting portion 31 connects the first wire 30 and the first main surface 20a of the source electrode layer 20 to each other by ultrasonic waves, such as wire bonding, regardless of the cross-sectional shape of the first wire 30, such as a circle or a rectangle, the cross section of the connecting portion 31 has a crushed cross-sectional shape in a direction orthogonal to the direction in which the plurality of connecting portions 31 are arranged.

Due to the large number of connecting portions 31 included in the first wire 30, the area where the first wire 30 and the first main surface 20a of the source electrode layer 20 are joined becomes large. Increasing the area to be joined means that the first wire 30 and the first main surface 20a of the source electrode layer 20 are electrically connected in a large area. As a result, the resistance between the first wire 30 and the first main surface 20a of the source electrode layer 20 can be reduced. For example, the first wire 30 having the two connecting portions 31 electrically connects the two portions of the first main surface 20a of the source electrode layer 20. Further, the first wire 30 having the three connecting portions 31 electrically connects the three portions of the first main surface 20a of the source electrode layer 20. Further, the first wire 30 having four or more connecting portions 31 electrically connects four or more portions of the first main surface 20a of the source electrode layer 20. Providing a plurality of connecting portions 31 with respect to one first wire 30 increases the area in which the first wire 30 and the first main surface 20a of the source electrode layer 20 are electrically connected.

Further, since the area of one connecting portion 31 is large, the resistance between the first wire 30 and the source electrode layer 20 can be reduced. The relationship between the area of the connecting portion 31 and the circle-converted diameter of the first wire 30 is preferably as follows: (area of the connecting portion 31)$>\pi \times ((\text{circle-converted diameter of the first wire } 30)/2 \times 1.2)^2$. Further, the relationship between the area of the connecting portion 31 and the thickness of the source electrode layer 20 may preferably be as follows: (area of the connecting portion 31)$>((3600/(\text{thickness of the source electrode layer } 20)))$. By making the shape of the connecting portion 31 wide in the direction orthogonal to the direction in which the plurality of connecting portions 31 are lined up on one first wire 30, the resistance between the first wire 30 and the source electrode layer 20 can be further reduced.

The first wire 30 may be made of, for example, aluminum, an aluminum alloy, copper, or a copper alloy. The circle-equivalent diameter of the cross section of the first wire 30 may be 10 μm or more and 200 μm or less, and may be 10 μm or more and 80 μm or less. When the circle-equivalent diameter is 10 μm or more, the resistance of the first wire 30 can be lowered. Further, when the circle-equivalent diameter is 200 μm or less, the step of arranging the second wire 33, which will be described later, on the first main surface 20a of the source electrode layer 20 becomes easy.

The larger the area (joint area) of the connecting portion 31 where the first wire 30 and the first main surface 20a of the source electrode layer 20 are joined, the smaller the resistance of the path of the current flowing through the source electrode layer 20. Therefore, the area of one connecting portion 31 is increased, or a plurality of connecting portions 31 are provided to increase the total area of the connecting portions 31. As a result, the resistance of the path of the current flowing through the source electrode layer 20 is reduced, so that the on-resistance of the semiconductor device 1 can be reduced.

Further, by increasing the circle-equivalent diameter of the first wire 30 (if the first wire 30 is circular, the diameter thereof), the resistance of the path of the current flowing through the source electrode layer 20 can be further reduced, thereby reducing the on-resistance of the semiconductor device 1.

The second wire 33 has conductivity. The second wire 33 may be arranged in a direction intersecting the direction in which the plurality of connecting portions 31 of the first wire 30 are arranged on the first main surface 20a of the source electrode layer 20 (the direction in which the first wire 30 extends).

In the plan view shown in FIG. 4, the second wire 33 is arranged on the first main surface 20a of the source electrode layer 20 so as to extend in the direction orthogonal to the extending direction of the first wire 30.

The circle-equivalent diameter of the second wire 33 is larger than the circle-equivalent diameter of the first wire 30.

Therefore, the circle-converted diameter of the cross section of the connecting portion 34 of the second wire 33 is larger than the circle-converted diameter of the cross section of the connecting portion 31 of the first wire 30.

Here, the cross section of the connecting portion 31 of the first wire 30 is a cross section taken in a direction orthogonal to the direction in which the first wire 30 extends. The cross section of the connecting portion 34 of the second wire 33 is a cross section taken in a direction orthogonal to the extending direction of the second wire 33.

A plurality of second wires 33 may be arranged on the first main surface 20a of the source electrode layer 20. The second wire 33 may have a plurality of connecting portions 34 that are electrically connected to the first main surface 20a of the source electrode layer 20. The connecting portion 34 is a portion where the second wire 33 and the source electrode layer 20 are joined.

The second wire 33 is a bonding wire one end of which is electrically connected to the source electrode layer 20, and the other end of which is electrically connected to a wiring pattern of a circuit board or an external terminal such as a lead frame (not shown).

The number of the second wires 33 connected to the first main surface 20a of the source electrode layer 20 may be smaller than that of the first wires 30. Further, the number of connecting portions 34 of the second wire 33 may be smaller than that of the connecting portions 31 of the first wire 30.

The circle-equivalent diameter of the first wire 30 is smaller than the circle-equivalent diameter of the second wire 33. The circle-equivalent diameter corresponds to the diameter of the first wire 30 and the second wire 33 when they are circular. As a result, the first wire 30 is connected (joined) to the first main surface 20a of the source electrode layer 20 to form the connecting portion 31. Also because the circle-equivalent diameter of the first wire 30 is smaller than that of the second wire 33, damage caused to the semiconductor element 10 when the first wire 30 is cut after the connecting portion 31 is formed can be reduced.

The plurality of connecting portions 34 are formed by arranging the second wire 33 on the first main surface 20a of the source electrode layer 20 and by electrically connecting a plurality of locations of the second wire 33 to the first main surface 20a of the source electrode layer 20 using ultrasonic waves as in wire bonding. The number of connecting portions 34 included in the second wire 33 may be 1 or more. Within one second wire 33, the portion of the second wire 33 between the two adjacent connecting portions 34 is not in contact with the first main surface 20a of the source electrode layer 20.

Like the first wire 30, the second wire 33 also has a connection peripheral portion 35 around the connecting portion 34. As shown in FIG. 6, the connection peripheral portion 35 is provided in the direction in which a plurality of connecting portions 34 provided in one second wire 33 are lined up (direction in which the second wire 33 extends).

The connection peripheral portion 35 corresponds to the boundary between the portion of the second wire 33 that is crushed and the portion that is not crushed when the connecting portion 34 is formed by using ultrasonic waves in the upper part of the connecting portion 34 of the second wire 33.

Here, the connection peripheral portion 35 may not be provided in the direction orthogonal to the direction in which the plurality of connecting portions 34 are arranged. For example, when the connecting portion 34 is formed by using ultrasonic waves as in wire bonding, the upper portion of the connecting portion 34 of the second wire 33 in the direction orthogonal to the direction in which the plurality of connecting portions 34 are arranged may all be crushed by ultrasonic waves.

The first wire 30 shown in FIG. 4 has end portions 30a at both ends in the direction in which the first wire 30 extends. The first wire 30 has a pair of side surfaces 30b opposite to each other along the direction in which the first wire 30 extends. The second wire 33 shown in FIG. 4 has one end portion 33a in the direction in which the second wire 33 extends. The second wire 33 has a pair of side surfaces 33b opposite to each other along the direction in which the second wire 33 extends. As shown in FIG. 4, the end portion 33a of the second wire 33 may be in contact with the side surface 30b of the first wire 30.

When the end portion 33a of the second wire 33 comes into contact with the side surface 30b of the first wire 30, the first wire 30 and the second wire 33 are electrically connected. As a result, the resistance of the current path flowing through the source electrode layer 20 can be further reduced, and the on-resistance of the semiconductor device 1 can be reduced.

The second wire 33 may be made of, for example, aluminum, an aluminum alloy, copper, or a copper alloy. The circle-equivalent diameter of the cross section of the second wire 33 may be 150 μm or more and 500 μm or less, and may be 200 μm or more and 500 μm or less. When the circle-equivalent diameter is 150 μm or more, sufficient electric power can be supplied to the source electrode layer 20 from the external terminal. Further, when the circle-equivalent diameter is 500 μm or less, the second wire 33 becomes easy to handle. Therefore, the step of arranging the second wire 33 on the first main surface 20a of the source electrode layer 20 becomes easy. Further, if the circle-equivalent diameter were 500 μm or more, the damage generated at the time of wire bonding would become too large, and it would be necessary to increase the thickness of the source electrode layer 20. In addition, it would be necessary to enlarge the wiring pattern of the circuit board or the external terminal of the lead frame to which second wire 33 is to be connected.

The third wire 36 has conductivity and is arranged on the gate electrode layer 21 so as to extend in parallel with the extending direction of the second wire 33. The third wire 36 has a connecting portion 37 that electrically connects to the gate electrode layer 21. The connecting portion 37 is a portion where the third wire 36 and the gate electrode layer 21 are joined.

The third wire 36 is a bonding wire such that one end of the third wire 36 is electrically connected to the gate electrode layer 21, and the other end of the third wire 36 is electrically connected to a wiring pattern of a circuit board or an external terminal such as a lead frame (not shown). The third wire 36 may be made of, for example, aluminum, an aluminum alloy, copper, a copper alloy, or gold.

The semiconductor element 10 of FIG. 5 includes a plurality of cells having the same structure. Here, the following description will be given focusing on two cells C1 and C2 having different distances from the end portion 34a of the connecting portion 34 of the second wire 33. Although the cell C1 and the cell C2 have the same structure, the position of the cell C2 with respect to the end portion 34a of the connecting portion 34 of the second wire 33 is farther from the position of the cell C1. It should be noted that the plurality of cells of the semiconductor element 10 may not have to have the same structure. The end portion 34a of the connecting portion 34 of the second wire 33 is the end of the portion where the source electrode layer 20 and the second wire 33 are joined in the cross-sectional view taken in the direction orthogonal to the extending direction of the second wire 33 shown in FIG. 5.

During operation of the semiconductor device 1, in cells C1 and C2, a voltage equal to or higher than the threshold value is applied to the gate electrode 14 via the third wire 36 and the gate electrode layer 21, so that a current flows from the drain electrode layer 19 to the n+ source region 16.

In the cell C2, the path through which the current flows has a first path L1 flowing from the n+ source region 16 to the end portion 34a of the connecting portion 34 of the second wire 33 via the source electrode layer 20, and a second path L2 flowing from the n+ source region 16 to the end portion 34a of the connecting portion 34 of the second wire 33 via the n+ source region 16 to the source electrode layer 20, from the connecting portion 31 to the first wire 30, and from the connecting portion 31 of the first wire 30 to the source electrode 20 via the source electrode layer 20.

When the end portion 30a of the first wire 30 and the side surface 33b of the second wire 33 are electrically connected, the path further includes a third path L3 to the end portion 34a of the connecting portion 34 of the second wire 33 from the n+ source region 16 to the source electrode layer 20, from the connecting portion 31 to the first wire 30, from the end portion 30a of the second wire 33 to the side surface 33b of the second wire 33.

Since the connecting portion 31 of the first wire 30 is electrically connected to the first main surface 20a of the source electrode layer, the resistance of the first wire 30 in the second path L2 and the third path L3 is smaller than the sheet resistance of the first path L1 flowing from the cell C2 to the end portion 34a of the connecting portion 34 of the second wire 33 through the electrode layer 20. Therefore, in the cell C2, when the end portion 30a of the first wire 30 and the side surface 33b of the second wire 33 are not electrically connected, the current mainly passes through the second path L2 from n+ source region 16 to the second wire 33. When the end portion 30a of the first wire 30 and the side surface 33b of the second wire 33 are electrically connected, the current flowing from the n+ source region 16 to the second wire 33 mainly through the third path L3.

In the cells C1 and C2, the resistance r0 of the path through which the current flows from the drain electrode layer 19 to the n+ source region 16 and the resistance r1 in the thickness direction of the source electrode layer 20 are respectively the same. The resistance of the first wire 30 in the second path L2 and the third path L3 can be reduced as the area of the connecting portion 31 connecting the first wire 30 and the first main surface 20a of the source electrode layer 20 is increased. As a result, in the semiconductor element 10, by providing a plurality of first wires 30 having a plurality of connecting portions 31 on the first main surface 20a of the source electrode layer 20, the same effect as when the resistance of the electrode layer 20 is reduced by increasing the thickness of the source electrode layer 20 can be obtained.

Further, because the first wires 30 having the plurality of connecting portions 31 are arranged in the direction orthogonal to the extending direction of the second wires 33, a large number of the connecting portions 31 that connect the first wires 30 and the first main surface 20a of the source electrode layer 20 can be provided. As a result, the bonding area between the first wire 30 and the first main surface 20a of the source electrode layer 20 can be made larger.

Further, because the first wires 30 having the plurality of connecting portions 31 are arranged in the direction orthogonal to the direction in which the second wire 33 extends, the end portions 30a of the plurality of first wires 30 and the side surfaces 33b of the second wire 33 can be electrically connected so that a plurality of third paths L3 can be formed.

Therefore, because the first wires 30 having the plurality of connecting portions 31 are arranged in the direction orthogonal to the direction in which the second wire 33 extends, the resistance between the first wire 30 and the source electrode layer 20 is further reduced, making it easier to obtain the same effect as when the thickness of the source electrode layer 20 is substantially increased. As a result, the on-resistance of the semiconductor device 1 can be reduced without changing the structure or the manufacturing process of the semiconductor device 1.

Next, it will be shown that the on-resistance of the semiconductor element 10 is reduced according to the number of the first wires 30 and the second wires 33 and the number of connecting portions described above.

Figure 8:
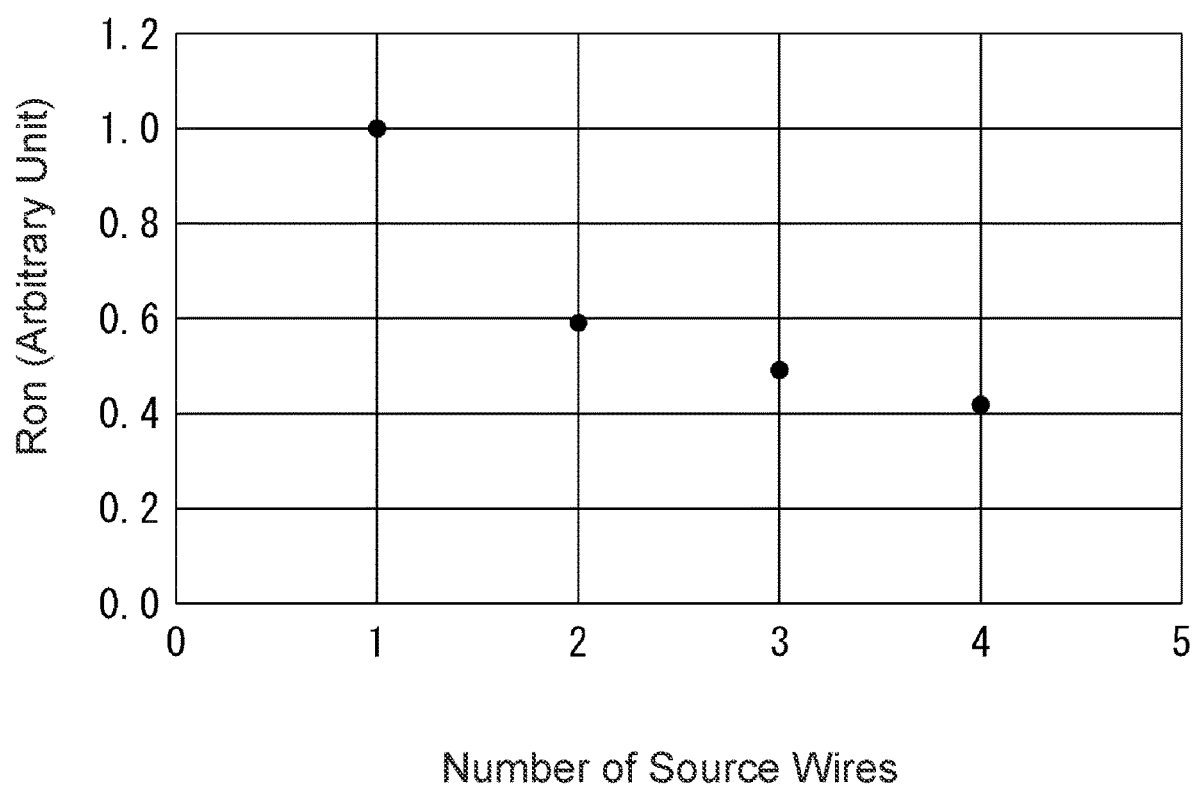
FIG. 8 is a diagram showing the relationship between the on-resistance Ron and the number of source wires.
Figure 9:
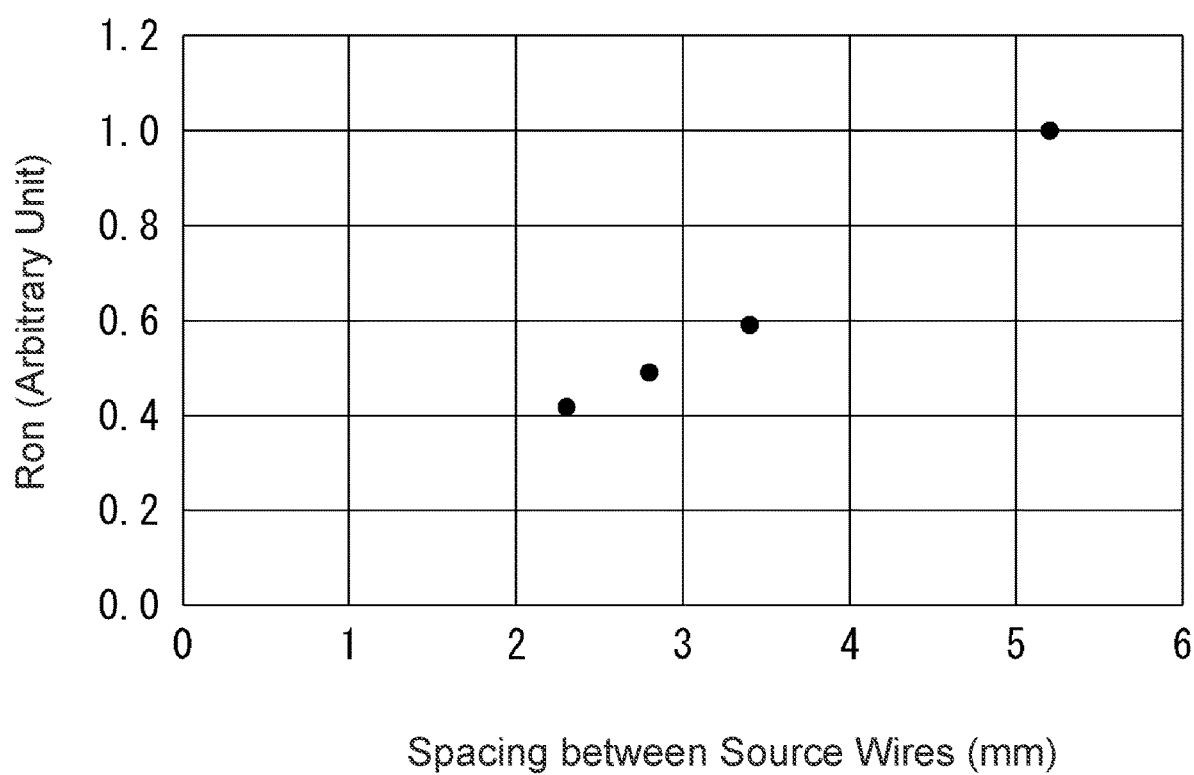
FIG. 9 is a diagram showing the relationship between the on-resistance Ron and the spacing between the source wires.

FIGS. 7A-7D show experimental examples of the source wires 40 corresponding to the second wires 33 connected on the source electrode layer 20. FIG. 8 shows the relationship between the on-resistance Ron of the semiconductor element 10 and the number of source wires 40. FIG. 9 shows the relationship between the on-resistance Ron and the spacing between the source wires.

Figure 7A:
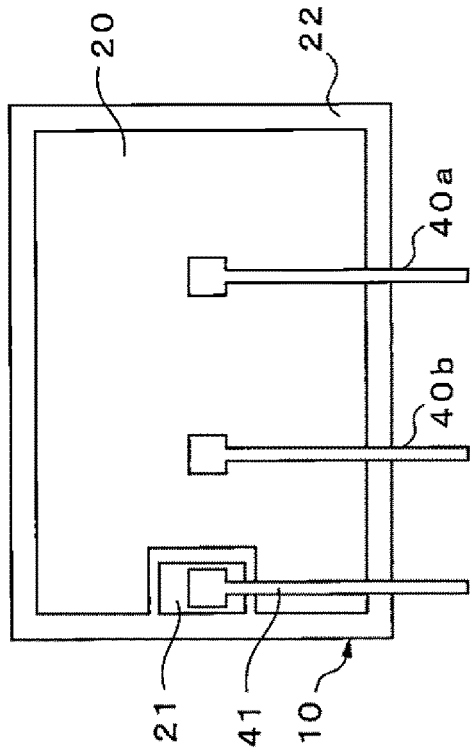
FIGS. 7A-7D are diagrams showing experimental examples.

In FIG. 7A, one end of the source wire 40a is connected on the source electrode layer 20 of the semiconductor element 10, and one end of the gate wire 41 is connected on the gate electrode layer 21. The other end of the source wire 40a is connected to the source probe terminal (not shown) and the other end of the gate wire 41 is connected to the gate probe terminal (not shown). Then, the semiconductor element 10 is mounted such that the drain electrode layer 19 of the semiconductor element 10 is electrically connected to a die pad (not shown) for measurement, and the semiconductor element 10 is operated to measure the on-resistance.

Figure 7B:
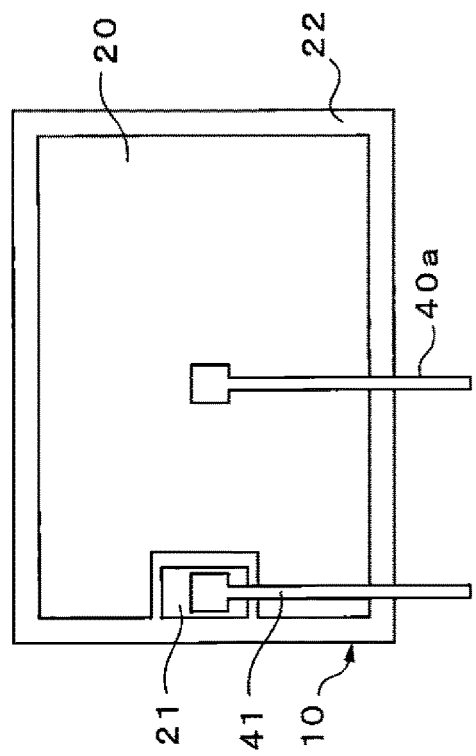

Further, in FIG. 7B, respective one ends of the source wire 40a and the source wire 40b are connected to the source electrode layer 20 of the semiconductor element 10 at intervals. The other ends of the source wire 40a and the source wire 40b are respectively connected to a source probe terminal (not shown), so that the source wire 40a and the source wire 40b have the same potential.

One end of the gate wires 41 is connected on the gate electrode layer 21. The other end of the gate wire 41 is connected to a gate probe terminal (not shown).

The semiconductor element is mounted such that the drain electrode layer 19 of the semiconductor element 10 is electrically connected to a measurement die pad (not shown), and the semiconductor element 10 is operated to measure the on-resistance.

Figure 7C:
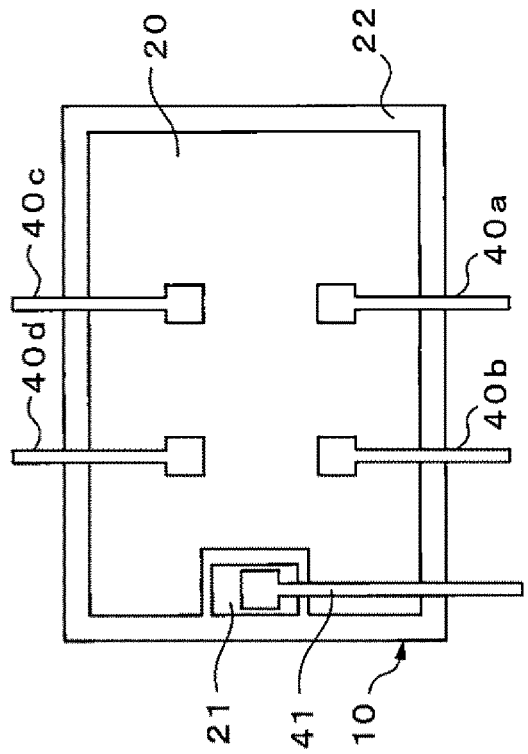

Further, in FIG. 7C, respective one ends of the source wire 40a, the source wire 40b, and the source wire 40c are connected on the source electrode layer 20 of the semiconductor element 10 with the same interval. The other ends of the source wire 40a, the source wire 40b, and the source wire 40c are connected to a source probe terminal (not shown) so that the source wire 40a, the source wire 40b, and the source wire 40c have the same potential.

One end of the gate wires 41 is connected on the gate electrode layer 21. The other end of the gate wire 41 is connected to a gate probe terminal (not shown).

The semiconductor element 10 is mounted such that the drain electrode layer 19 of the semiconductor element 10 is electrically connected to a measurement die pad (not shown), and the semiconductor element 10 is operated to measure the on-resistance.

Figure 7D:
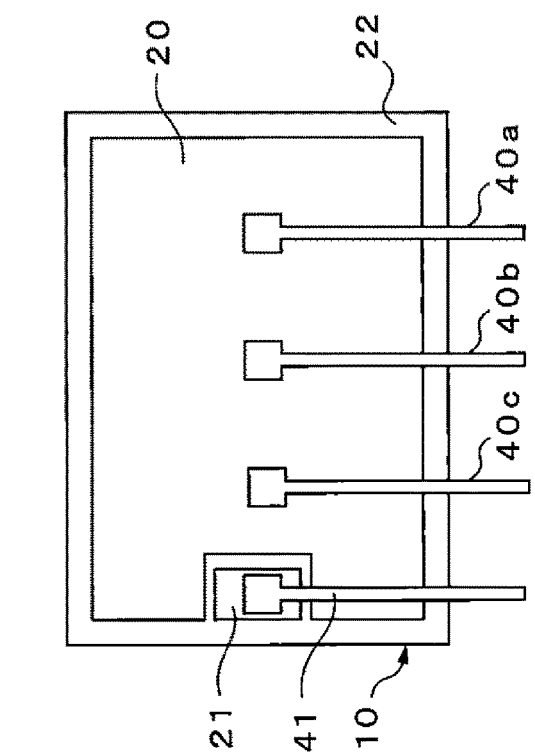

Further, in FIG. 7D, respective one ends of the source wire 40a, the source wire 40b, the source wire 40c, and the source wire 40d are connected on the source electrode layer 20 of the semiconductor element 10 with the same interval.

The ends of the source wire 40a, the source wire 40b, and the source wire 40c, and the source wire 40d are connected to a source probe terminal (not shown) so that the source wire 40a, the source wire 40b, the source wire 40c, and the source wire 40d have the same potential.

One end of the gate wires 41 is connected on the gate electrode layer 21. The other end of the gate wire 41 is connected to a gate probe terminal (not shown).

The semiconductor element 10 is mounted such that the drain electrode layer 19 of the semiconductor element 10 is electrically connected to a measurement die pad (not shown), and the semiconductor element 10 is operated to measure the on-resistance.

FIG. 8 shows the relationship between the on-resistance Ron and the number of source wires 40. The on-resistance Ron on the vertical axis is obtained by subtracting the resistance of the source wire 40 and the resistance of the measurement die pad on which the semiconductor element 10 is mounted from the measured on-resistance of the samples shown in FIGS. 7A-7D, respectively, to obtain only the on-resistance of the semiconductor element 10 for each sample. As shown in FIG. 8, it was confirmed that as the number of source wires connected to the first main surface 20a of the source electrode layer 20 increases, the on-resistance Ron decreases. Since each source wire has the same potential, increasing the number of source wires corresponds to increasing the number of connecting portions 34 of the second wires 33. An increase in the number of source wires 40 corresponds to an increase in the area where the source electrode layer 20 and the second wire 33 are electrically connected.

This result can be applicable to the first wires 30. Therefore, by increasing the area where the source electrode layer 20 and the first wire 30 are electrically connected, the on-resistance of the semiconductor element 10 can be reduced.

Further, when the area where the source electrode layer 20 and the first wire 30 are electrically connected increases, at the same time, the distance between the first wire 30 and the second wire 33 becomes shorter. As a result, the path of the current flowing through the source electrode layer 20 having a large resistance is shortened, and the on-resistance of the semiconductor element 10 can be reduced.

FIG. 9 shows the relationship between the on-resistance Ron and the distance between the source wires 40. When the number of source wires 40 is one (see FIG. 7A), the distance between the source wires 40a and the edge of the source electrode layer 20 is defined as the distance between the source wires 40a. The on-resistance Ron on the vertical axis is obtained by subtracting the resistance of the source wire 40 and the resistance of the measurement die pad on which the semiconductor element 10 is mounted from the measured on-resistance for the respective samples shown in FIGS. 7A-7D so as to obtain only the on-resistance of the semiconductor element 10 for each sample. As shown in FIG. 9, it was confirmed that the on-resistance Ron of the semiconductor element 10 decreases as the distance between the source wires 40 decreases (narrows).

This result can be applicable to the first wires 30. Therefore, as the distance between the connecting portions 31 of the first wire 30 electrically connected to the source electrode layer 20 is reduced (the distance is narrowed), the on-resistance of the semiconductor element 10 can be reduced. Further, as the distance between the plurality of first wires 30 electrically connected to the source electrode layer 20 is reduced (the distance is narrowed), the on-resistance of the semiconductor element 10 can be reduced.

According to the semiconductor device of the present embodiment described above, the effect of having a low on-resistance is achieved.

Figure 10:
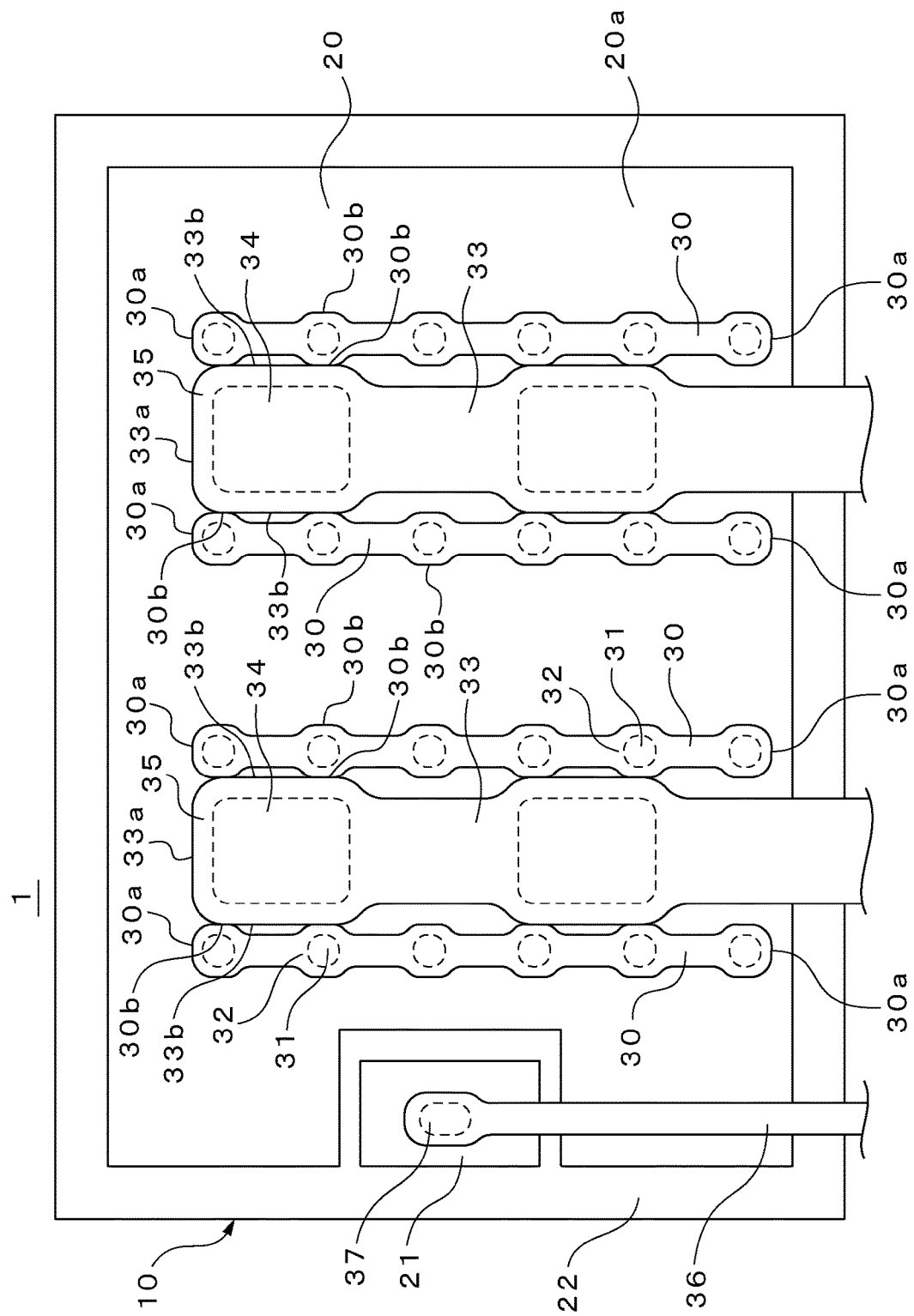
FIG. 10 is a plan view showing a modified example of the semiconductor device of the first embodiment of the present invention.

FIG. 10 is a diagram showing a modified example of the semiconductor device of the first embodiment. In the semiconductor device 1 of this modified example, the direction in which the first wire 30 extends is parallel to the direction in which the second wire 33 extends. The side surface 30b of the connecting portion 31 of the first wire 30 is in contact with the side surface 33b of the connecting portion 34 of the second wire 33 and are electrically connected to each other. The first wire 30 having the plurality of connecting portions 31 is electrically connected to the second wire 33 in the direction in which the first wire 30 extends. Therefore, the plurality of connecting portions 31 of the first wire 30 and the second wire 33 are electrically connected on the first main surface 20a of the source electrode layer 20.

Next, other embodiments of the above-mentioned semiconductor device will be described with reference to FIGS. 11 to 17. The detailed description of the first embodiment described above is appropriately applied to the elements not particularly described with respect to the other embodiments. Further, the same components are designated by the same reference numerals.

Figure 11:
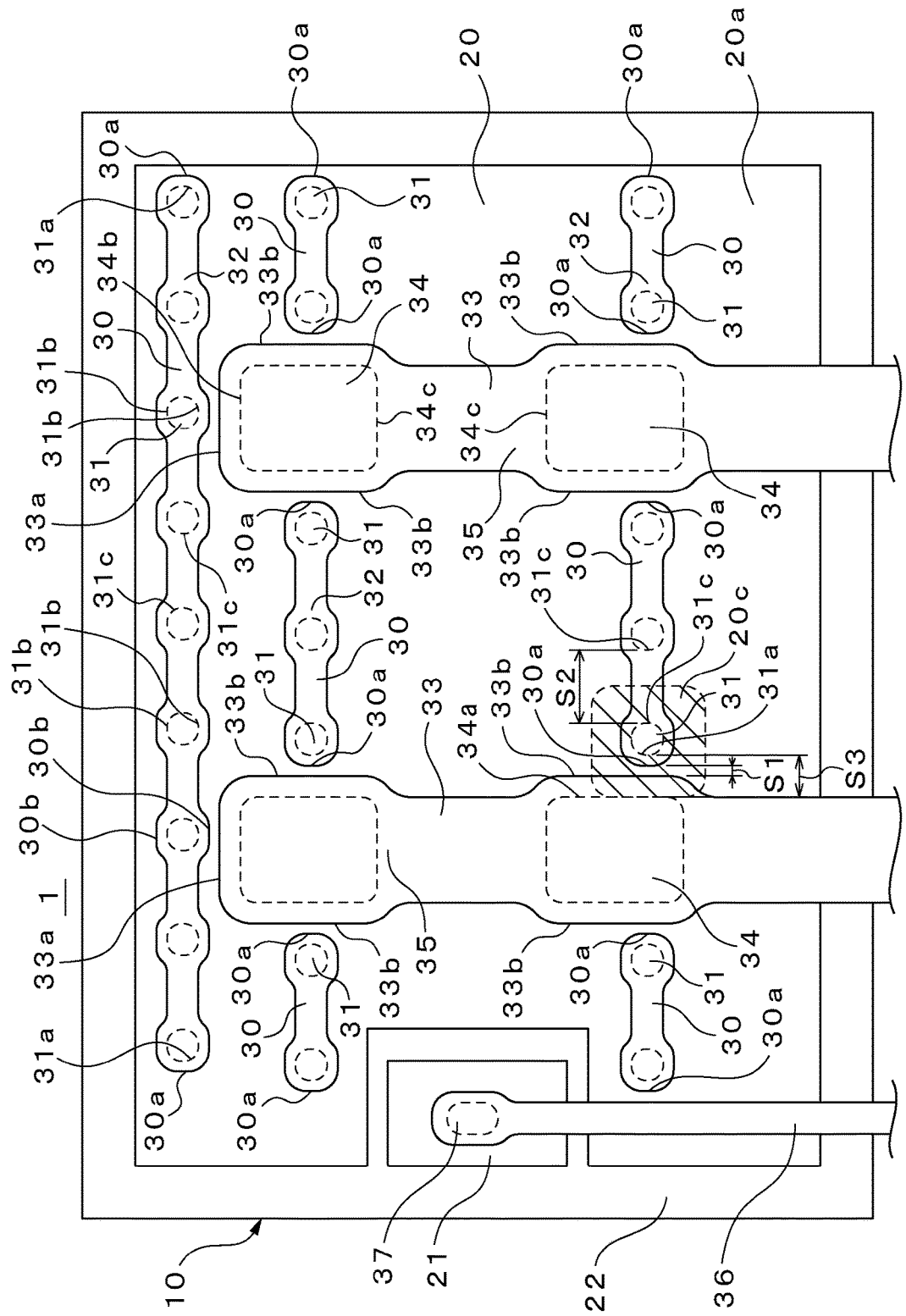
FIG. 11 is a plan view showing a semiconductor device according to a second embodiment of the present invention.

FIG. 11 is a plan view showing a semiconductor device of a second embodiment according to the present invention.

The semiconductor device 1 of the present embodiment is different from the first embodiment in that the first wire 30 is not physically in contact with (not connected to) the second wire 33.

The first wire 30 shown in FIG. 11 has end portions 30a and 30a at both ends in the direction in which the first wire 30 extends. The connecting portion 31 closest to the end portion 30a of the first wire 30 has two end portions 31a and 31c opposite to each other in the direction in which the first wire 30 extends. The end portion 31a is located on the outer side (end portion 30a side) of the first wire 30, and the end portion 31c is located on the inner side. Further, among the plurality of connecting portions 31 included in the first wire 30, the connecting portions 31 located inward of the connecting portion 31 closest to the end portion 30a have a pair of end portions 31c and 31c that are opposite to each other in the direction in which the first wire 30 extends. The connecting portion 31 of the first wire 30 has two end portions 31b, 31b opposite to each other in a direction orthogonal to the extending direction of the first wire 30. The first wire 30 has a pair of side surfaces 30b opposite to each other along the direction in which the first wire 30 extends.

The second wire 33 shown in FIG. 11 has one end portion 33a in the direction in which the second wire 33 extends. The connecting portion 34 located closest to the end portion 33a of the second wire 33 has two end portions 34b, 34c opposite to each other in the direction in which the second wire 33 extends. The end portion 34b is located on the outside of the second wire 33 and the end portion 34c is located on the inside. Further, among the plurality of connecting portions 34 of the second wire 33, the connecting portions 34 located inward of the connecting portion 34 closest to the end portion 33a have a pair of end portions 34c, 34c that are opposite to each other in the direction in which the second wire 33 extends. The second wire 33 has a pair of side surfaces 33b opposite to each other along the direction in which the second wire 33 extends. The connecting portion 34 of the second wire 33 has a pair of end portions 34a, 34a opposite to each other in a direction orthogonal to the extending direction of the second wire 33.

The side surface 30b of the connecting portion 31 of the first wire 30 and the end portion 33a of the second wire 33 are separated from each other.

The end portion 30a of the first wire 30 and the side surface 33b of the connecting portion 34 of the second wire 33 are separated by a distance S1.

Further, the end portion 31a of the connecting portion 31 provided at the position closest to the end portion 30a of the first wire 30 and the end portion 34a of the connecting portion 34 of the second wire 33 are separated by a distance S3.

The shorter the distance S1 and the distance S3, the smaller the resistance of the portion of the source electrode layer 20 between the second wire 33 and the first wire 30.

The on-resistance of the semiconductor element 10 and the resistance (sheet resistance) of the source electrode layer 20 will be described with reference to the example shown in FIG. 11.

In FIG. 11, all of the connecting portions 34 of the second wire 33 are electrically connected to the first main surface 20a of the source electrode layer 20, and all of the connecting portions 31 of the first wire 30 are electrically connected to the first main surface 20a of the source electrode layer 20.

Here, suppose that the on-resistance of the semiconductor element 10 is Rc. Further, let Rs be the resistance (seat resistance) of a region 20c that surrounds the connecting portion 31 that electrically connects the first wire 30 to the first main surface 20a of the source electrode layer 20 by the distance S3, which is a distance between the end portion 31a of the connecting portion 31 and the end portion 34a of the connecting portion 34 of the second wire 33 facing the end portion 31a.

The on-resistance Rc of the semiconductor element 10 and the resistance Rs of the region 20c surrounding the connecting portion 31 of the first wire 30 preferably satisfy the relationship of 0≤Rs/Rc≤0.2.

The above-mentioned relationship will be described below with reference to FIGS. 12 to 14B. It should be noted that FIGS. 12 to 14B show the case where the first wire 30 is connected to the source terminal (not shown) like the second wire 33.

Figure 12:
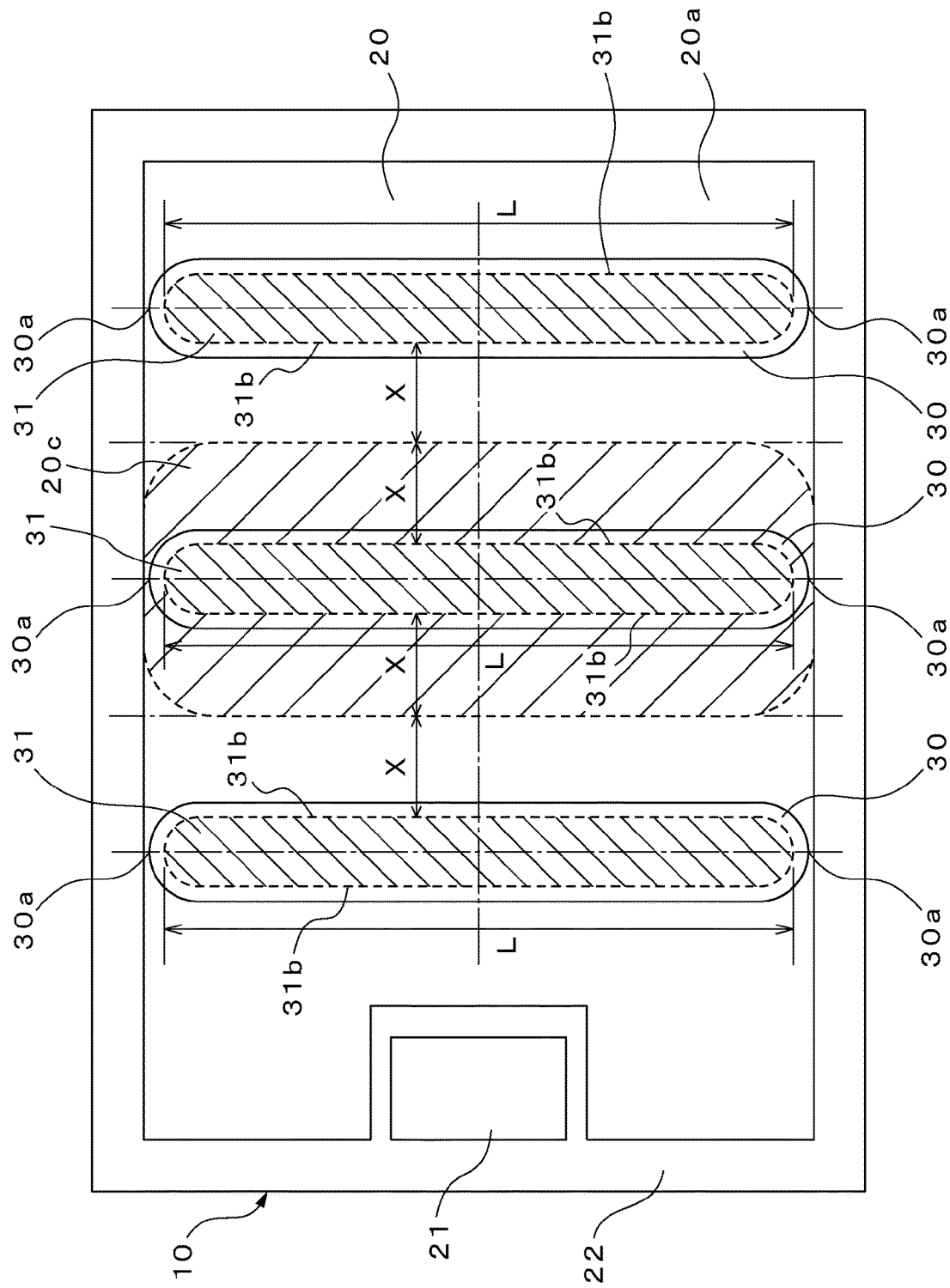
FIG. 12 is a diagram for explaining the relationship between the ratio Rs/Rc of the resistance Rs of the source electrode layer to the on-resistance Rc of the main body of the device and the distance X.
Figure 13:
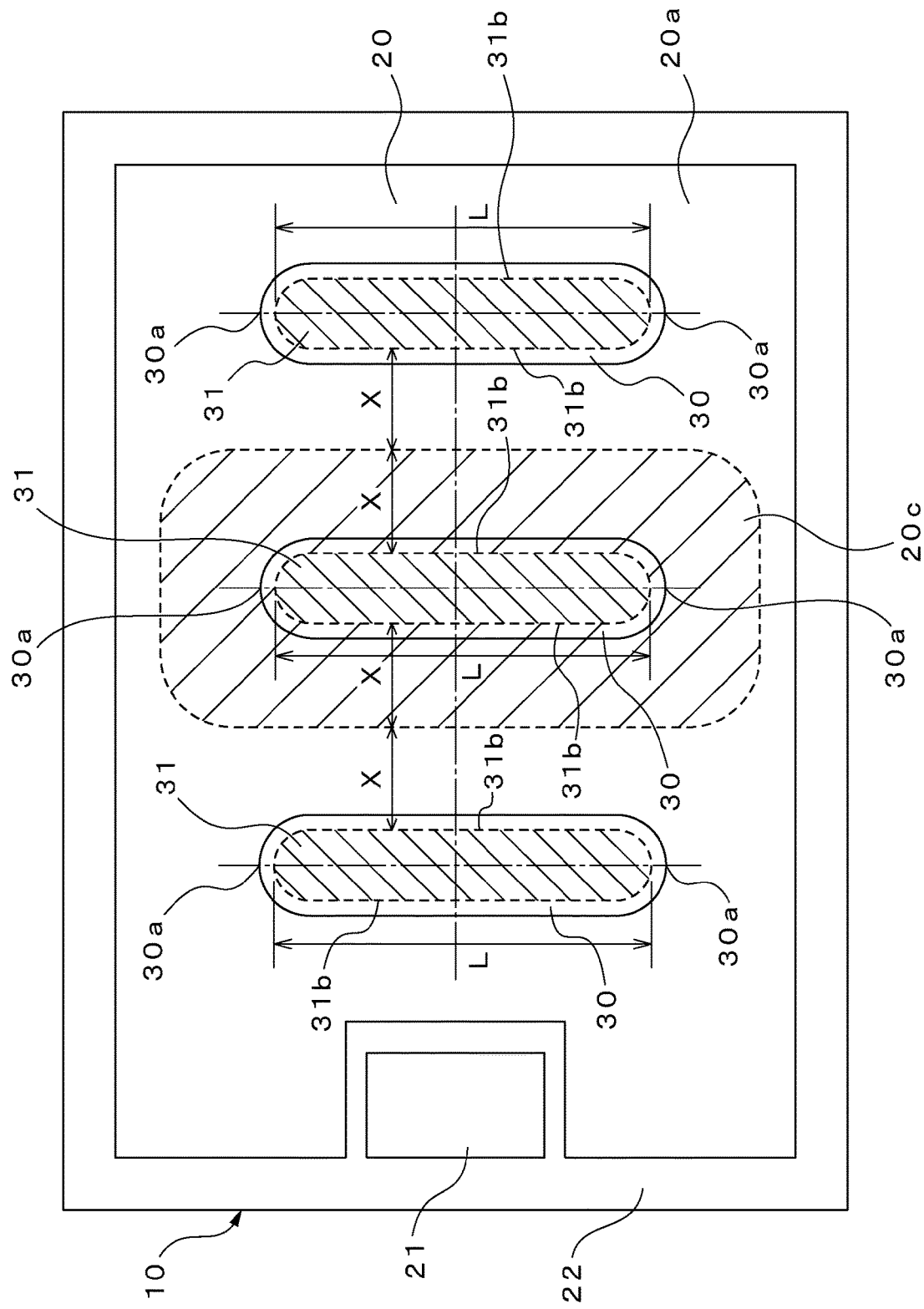
FIG. 13 is another diagram for explaining the relationship between the ratio Rs/Rc of the resistance Rs of the source electrode layer to the on-resistance Rc of the main body of the device and the distance X.
Figure 14A:
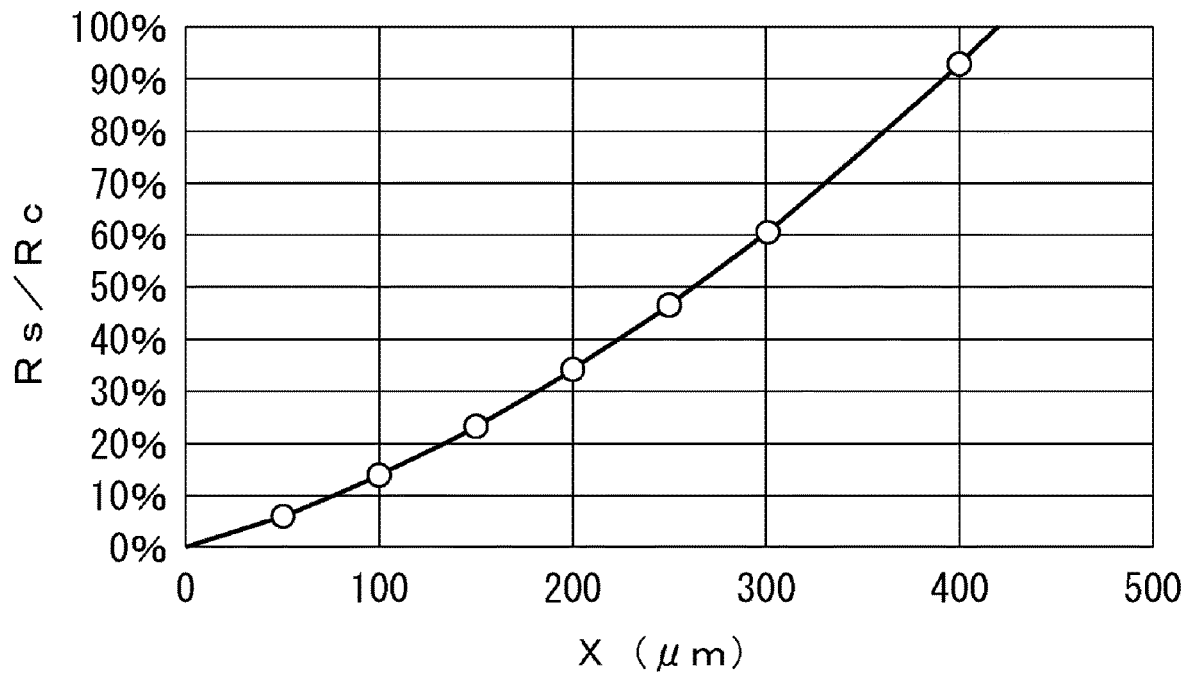
FIGS. 14A and 14B are diagrams for explaining the relationship between the ratio Rs/Rc of the resistance Rs of the source electrode layer to the on-resistance Rc of the main body of the device and the distance X.
Figure 14B:
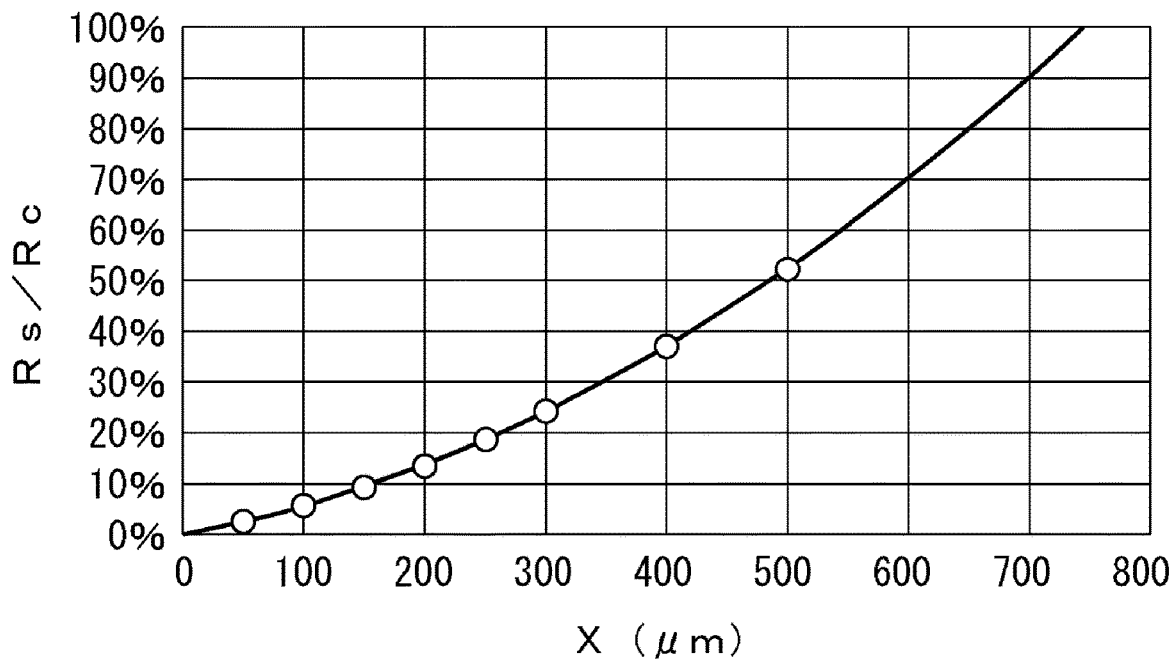

FIGS. 12 and 13 show cases in which the shape of the connecting portion 31 that electrically connects the first wire 30 to the first main surface 20a of the source electrode layer 20 is different. FIGS. 14A and 14B show the relationship between the distance X and the ratio Rs/Rc of the resistance Rs of the source electrode layer 20 to the on-resistance Rc of the semiconductor element 10 with respect to each of the cases of the connecting portion 31 shown in FIGS. 12 and 13, respectively.

In the case shown in FIG. 12, a plurality of first wires 30 are arranged so as to straddle between the opposing ends of the source electrode layer 20 in a plan view. The first wire 30 and the first main surface 20a of the source electrode layer 20 are electrically connected by the connecting portion 31 of the first wire 30.

In FIG. 12, in order to make the explanation easy to understand, the number of connecting portions 31 included in the first wire 30 is one, and the description of the connection peripheral portion 32 is omitted. Further, the description of the second wire 33 provided between the adjacent first wires 30 is omitted, and the intervals between the adjacent first wires 30 are equal.

Let a be the circle-equivalent diameter of the first wire 30. The circle-equivalent diameter is, for example, the diameter of the wire when the cross-sectional shape of the first wire 30 is circular, and may be the width of the surface connected to the first main surface 20a of the source electrode layer 20 when the cross-sectional shape is a quadrangle such as a ribbon wire.

Let L be the length of the connecting portion 31 between the opposing ends of the source electrode layer 20. For the adjacent first wires 30, half of the distance between the end portions 31b of the connecting portions 31 in the direction orthogonal to the extending direction of the first wires 30 is defined as the distance X.

Suppose that the on-resistance RonA per unit area of the semiconductor element 10 is a. Then, the on-resistance Rc of a region that includes the region 20c as well as the connecting portion 31 (i.e., the on-resistance Rc of the semiconductor element 10 up to half the distance X between the ends 31b of the connecting portion 31) is represented by the following formula (1).

$$Rc = \alpha/((k1 \times a + 2X) \times L) \quad (1)$$

Here, k1 is a parameter determined based on the conditions for forming the connecting portion 31 of the first wire 30, and (k1×a) represents the width of the area of the connecting portion 31, which depends on the circle-equivalent diameter a. Thus, Rc is the on-resistance of the area constituted of the region 20c and the connecting portion 31 indicated by the dashed lines in FIG. 12.

Further, let s' be the vertical cross-sectional area of the source electrode layer 20 at the region 20c surrounding the connecting portion 31 and let ρ be and the resistivity of the source electrode layer 20.

Let t be the thickness the source electrode layer 20 as measured from the upper surface of the n+ source region 16 to the upper surface (first main surface 20a) of the source electrode layer 20.

Then, the resistance Rs of the region 20c of the source electrode layer 20 separated by the distance X from the end portion 31b of the connecting portion 31 of the first wire 30 is represented by the following formula (2).

The resistance Rs is the resistance of the portion of the region 20c shown by the dotted line in FIG. 12 excluding the connecting portion 31.

$$Rs = \rho \times X/s' = \rho \times X/(2 \times L \times t) \quad (2)$$

Thus, Rs is the resistance of the surrounding region 20c in the lateral directions (left and right direction in this case). FIG. 14A shows the relationship between the distance X and the ratio Rs/Rc of the resistance Rs of the source electrode layer 20 to the on-resistance Rc of the semiconductor element 10 when the distance between the connecting portions 31 of the first wire 30 and the connecting portions 34 of the second wire 33 is narrow, for example, 200 μm or less, and when the areas of the connecting portion 31 and the connecting portion 34 of the second sire 33 (the bonding area of source electrode layer 20 and the first wire 30 and the second wire 33) is large. The ratio Rs/Rc increases with increasing distance X. The ratio Rs/Rc being zero (0=Rs/Rc) indicate the state where the second wire 33 is connected between the adjacent first wires 30, and the first wire 30 and the second wire 33 are in contact with each other and electrically connected.

In the state shown in FIG. 13, a plurality of first wires 30 are arranged on the first main surface 20a of the source electrode layer 20. The first wire 30 and the first main surface 20a of the source electrode layer 20 are electrically connected by the connecting portion 31 of the first wire 30.

In FIG. 13, in order to make the explanation easy to understand, the number of connecting portions 31 included in the first wire 30 is one, and the description of the connection peripheral portion 32 is omitted. Further, the description of the second wire 33 provided between the adjacent first wires 30 is omitted, and the intervals between the adjacent first wires 30 are equal.

In the first wire 30 shown in FIG. 13, the area where the connecting portion 31 is connected to the first main surface 20a of the source electrode layer 20 is smaller than that in the first wire 30 shown in FIG. 12.

Let a be the circle-equivalent diameter of the first wire 30. The circle-equivalent diameter is, for example, the diameter of the wire when the cross-sectional shape of the first wire 30 is circular, and may be the width of the surface connected to the first main surface 20a of the source electrode layer 20 when the cross-sectional shape is a quadrangle such as a ribbon wire.

In the adjacent first wires 30, half of the distance between the ends 31b of the connecting portions 31 in the direction orthogonal to the extending direction of the first wires 30 is defined as the distance X.

Suppose that the on-resistance RonA per unit area of the semiconductor element 10 is α. Then, the on-resistance Rc of a region including the region 20c as well as the connecting portion 31 (the on-resistance Rc of the semiconductor element 10 up to half the distance X between the ends 31b of the connecting portion 31) is represented by the following formula (3).

$$Rc = \alpha/((k1 \times a + 2X)(L + 2X)) = \alpha/(k2 \times a^2 + k3 \times a \times X + 4X^2) \quad (3)$$

Here, k2 and k3 are parameters determined based on the conditions for forming the connecting portion 31 of the first wire 30. The last expression is obtained by replacing L with ky×a (where ky is a constant depending on the forming condition of the connection portion 31), and redefining parameters as k2 and k3. Thus, Rc is the on-resistance of the area constituted of the region 20c and the connecting portion 31 indicated by the dashed lines in FIG. 13.

Let s' be the vertical cross-sectional area of the source electrode layer 20 in the region 20c surrounding the connecting portion 31. Let ρ be the resistivity of the source electrode layer 20.

Let t be the thickness the source electrode layer 20 as measured from the upper surface of the n+ source region 16 to the upper surface (first main surface 20a) of the source electrode layer 20.

Then, the resistance Rs in the region 20c separated from the end portion 31b of the connecting portion 31 of the first wire 30 by a distance X outward is represented by the following equation (4). The resistance Rs is the resistance of the portion of the region 20c shown by the dotted line in FIG. 13 excluding the connecting portion 31.

$$Rs = \rho \times \frac{X}{s'} = \rho \times X / (2((k1 \times a + 2X) + (L + 2X)) \times t) = \rho \times X / (2(k4 \times a + 4X) \times t) \quad (4)$$

Here, k4 is a parameter determined based on the conditions for forming the connecting portion 31 of the first wire 30. Thus, Rs is the resistance of the surrounding region 20c in the radial directions.

FIG. 14B shows the relationship between the distance X and the ratio Rs/Rc of the resistance Rs of the source electrode layer 20 to the on-resistance Rc of the semiconductor element 10 when the intervals between the connecting portion 31 of the first wire 30 and the connecting portion 34 of the second wire 33 are wider than, for example, 200 μm, and when the areas of the connecting portion 31 and the connecting portion 34 (the areas where the first wire 30 and the second wire 33 are connected to the source electrode layer 20) is small.

With reference to FIGS. 14A and 14B, it can be understood that when the ratio Rs/Rc is 0.2 (corresponding to 20%) or less, particularly 0.1 (corresponding to 10%) or less, the second wire 33 is electrically connected to a wide area of the first main surface 20a of the source electrode layer 20 with a small resistance via a plurality of connecting portions 31 of the first wire 30. The ratio Rs/Rc becomes 0.2 or less when the distance X is about 140 μm or less in the example shown in FIG. 14A and when the distance X is about 250 μm or less in the example shown in FIG. 14B.

Comparing FIGS. 14A and 14B, the value of the distance X at which the ratio Rs/Rc is the same is larger in FIG. 14B. This is because, in FIG. 14B, the area of the connecting portion 31 and the connecting portion 34 (the joining area where the source electrode layer 20 and the first wire 30 and the second wire 33 are joined) is small, and the value of Rc is large. Therefore, the on-resistance of the semiconductor element 10 is higher in the case of FIG. 14B.

The distance between the end portions 31b of the connecting portions 31 of the adjacent first wires 33 shown in FIG. 12 corresponds to twice the distance X, and thus, the distance between the end portions 31b of the adjacent connecting portions 31 is preferably 280 μm or less.

Further, for a single first wire 30 having a plurality of connecting portions 31 shown in FIG. 11, the distance S2 between the end portions 31c of the two adjacent connecting portions 31 may be such that 0≤Rs/Rc≤0.2 is satisfied and is preferably twice or less of the distance X that is determined so that the ratio Rs/Rc is 0.2 or less.

The narrower the interval S2, the smaller the resistance of the path of the current flowing through the source electrode layer 20. For example, the interval S2 is preferably 200 μm or less (distance X is 100 μm or less).

The portion of the first wire 30 between the two adjacent connecting portions 31 is not connected to the first main surface 20a of the source electrode layer 20, but can achieve good electric connection through the first wire 30 with respect to the second wire 33.

Thereby, the resistance between the first wire 30 and the source electrode layer 20 can be lowered.

Although the description of the second wire 33 is omitted in FIGS. 12 and 13, the above description regarding the first wire 30 and the connecting portion 31 is appropriately applied to the second wire 33 and the connecting portions 34. This completes the explanation of the relationship of 0≤Rs/Rc≤0.2. Next, the relationship between this relationship and the semiconductor device 1 shown in FIG. 11 will be described below.

The distance between the end portion 31b of the connecting portion 31 of the first wire 30 and the end portion 34b of the connecting portion 34 of the second wire 33 facing the end portion 31b may be such that 0≤Rs/Rc≤0.2 is satisfied, and is preferably is twice or less of the distance X that is determined so that the ratio Rs/Rc is 0.2 or less.

The distance between the end portion 31a of the connecting portion 31 of the first wire 30 and the end portion 34a of the connecting portion 34 of the second wire 33 facing the end portion 31a may be such that 0≤Rs/Rc≤0.2 is satisfied, and is preferably twice or less of the distance X that is determined so that the ratio Rs/Rc is 0.2 or less.

Further, in a single second wire 34 having a plurality of connecting portions 34, the distance between the two opposing end portions 34c of the adjacent connecting portions 34 may be such that 0≤Rs/Rc≤0.2 is satisfied, and is preferably twice or less of the distance X that is determined so that the ratio Rs/Rc is 0.2 or less. As a result, the resistance between the first wire 30 and the second wire 33 and the source electrode layer 20 can be reduced.

According to the semiconductor device of the embodiments described above, it is possible to have a low on-resistance by mounting a semiconductor element capable of reducing the resistance between the first wire 33 and the source electrode layer 20 on the semiconductor device.

Figure 15:
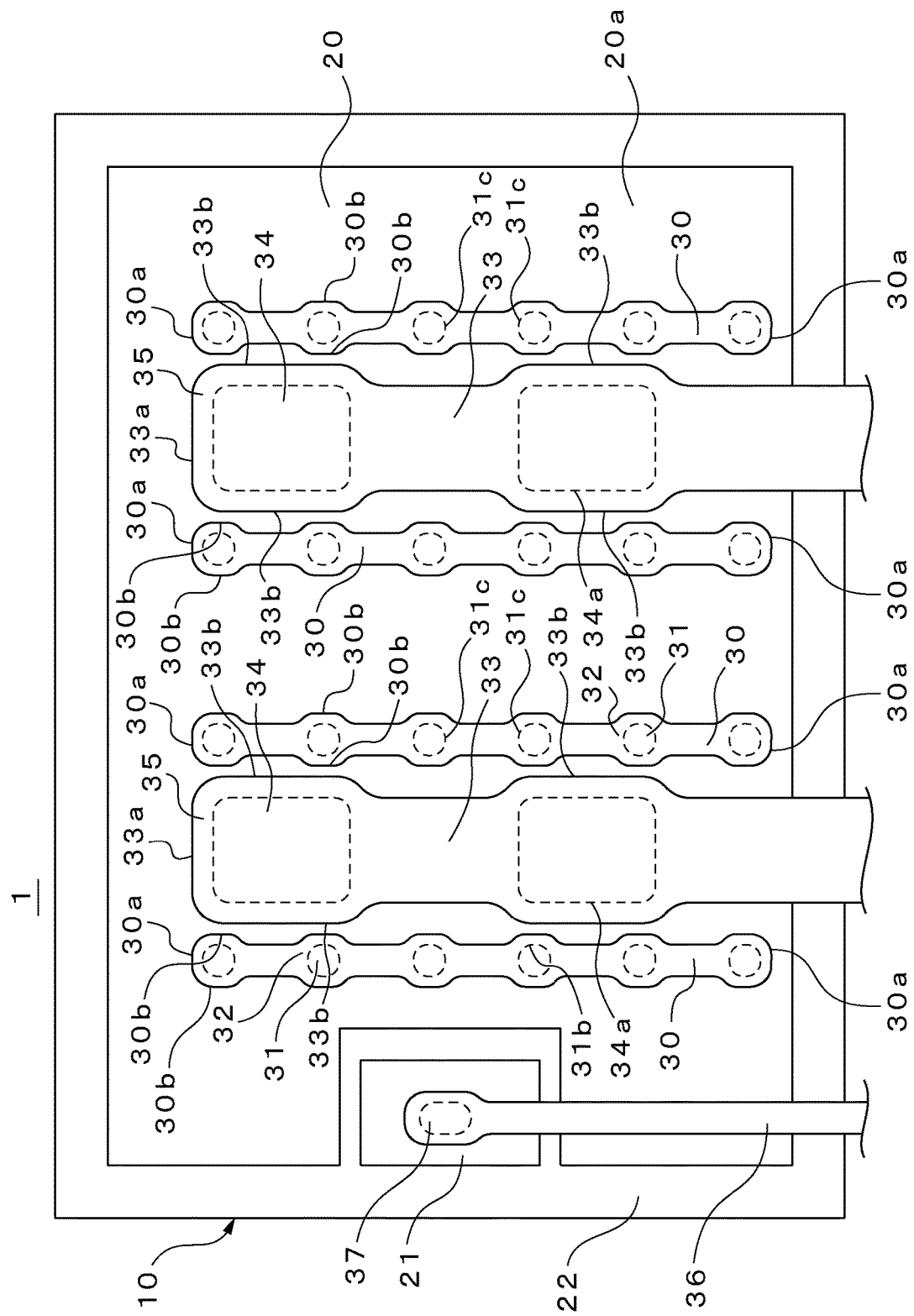
FIG. 15 is a plan view showing a modified example of the semiconductor device of the second embodiment of the present invention.

FIG. 15 is a diagram showing a modified example of the semiconductor device of the second embodiment. In the semiconductor element 10 of the semiconductor device 1 of this modified example, the direction in which the first wire 30 extends is parallel to the direction in which the second wire 33 extends. The first wire 30 and the second wire 33 are separated from each other. The distance between the end portion 31b of the connecting portion 31 of the first wire 30 and the end portion 34a of the connecting portion 34 of the second wire 33 facing the end portion 31b may be such that 0≤Rs/Rc≤0.2 is satisfied and is preferably twice of less of the distance X that is determined so that the ratio Rs/Rc is 0.2 or less.

Further, the distance between the two opposing end portions 31c of the adjacent connecting portions 31 of the first wire 30 may be such that 0≤Rs/Rc≤0.2 is satisfied, and preferably is twice or less of the distance X that is determined so that the ratio Rs/Rc is 0.2 or less.

Figure 16:
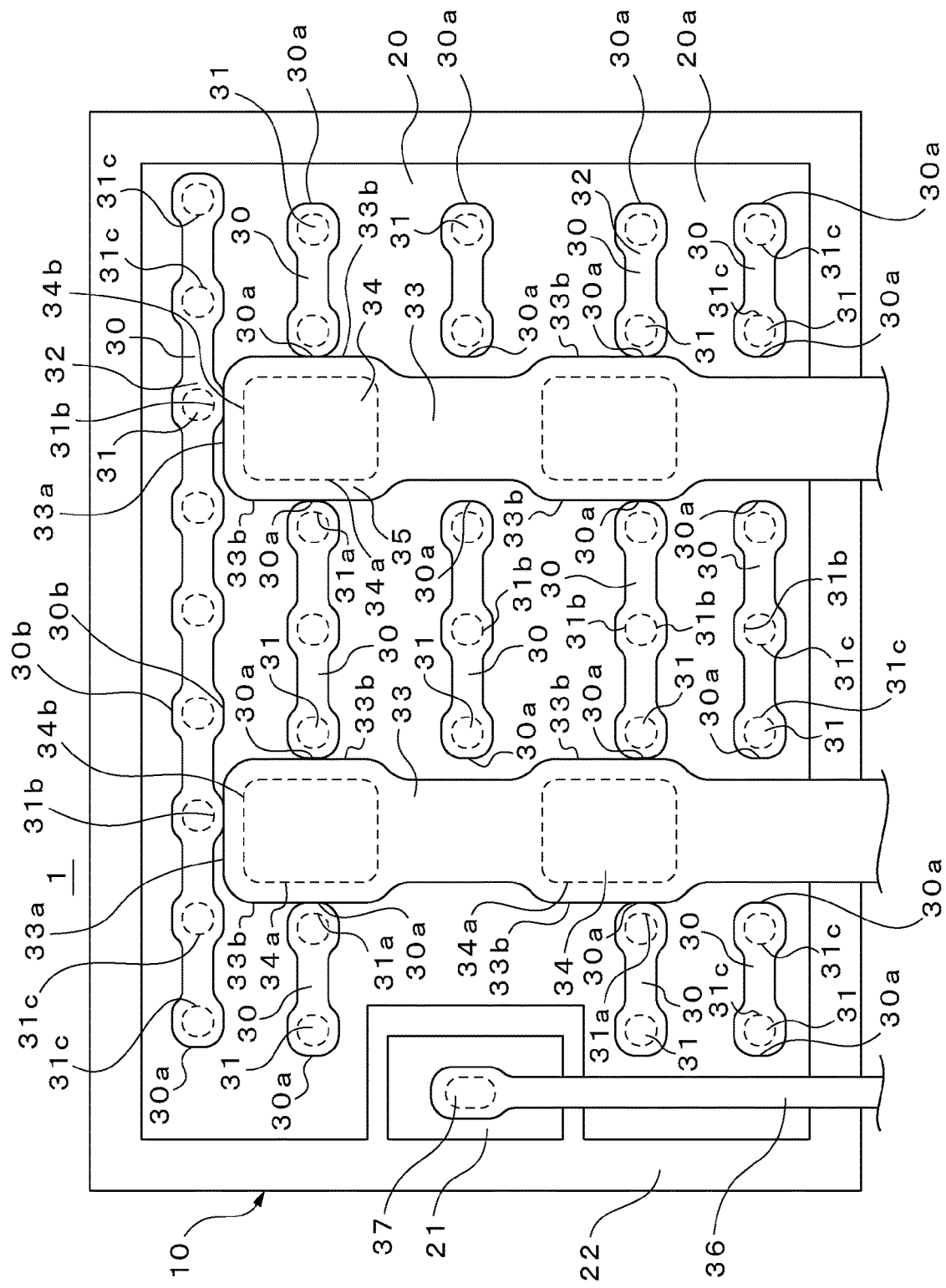
FIG. 16 is a plan view showing a semiconductor device according to a third embodiment of the present invention.

FIG. 16 is a plan view showing a third embodiment of the semiconductor device disclosed in the present specification. In the semiconductor element 10 of the semiconductor device 1 of the present embodiment, the direction in which the first wire 30 extends is orthogonal to the direction in which the second wire 33 extends. Further, the semiconductor element 10 of the semiconductor device 1 of the present embodiment has a first wire 30 that is physically in contact with the second wire 33 and a first wire 30 that is not physically in contact with the second wire 33.

With respect to some of the first wires 30, the side surface 30b of the connecting portion 31 of the first wire 30 and the end portion 33a of the second wire 33 are physically connected. Further, the end portion 30a of the first wires 30 and the side surface 33b of the connecting portion 34 of the second wire 33 are physically connected.

In FIG. 16, each of the two end portions 30a of the first wire 30 provided between the connecting portions 34 of the adjacent second wires 33 is physically attached to the side surface 33b of the connecting portion 34 of the second wire 33. However, only one of the two end portions 30a of the first wire 30 may be physically connected to the side surface 33b of the connecting portion 34 of the second wire 33.

Where the first wire 30 and the second wire 33 are physically connected, the distance between the end portion 31b of the connecting portion 31 of the first wire 30 and the end portion 34b of the connecting portion 34 of the second wire 33 may be such that 0≤Rs/Rc≤0.2 is satisfied and preferably is twice or less of the distance X that is determined so that the ratio Rs/Rc is 0.2 or less.

Where the second wire 33 and the first wire 30 are physically connected, the distance between the end portion 31a of the connecting portion 31 of the first wire 30 and the end portion 34a of the second wire 33 may also be such that 0≤Rs/Rc≤0.2 is satisfied, and is preferably twice or less of the distance X that is determined so that the ratio Rs/Rc is 0.2 or less.

Further, regardless of whether the second wire 33 and the first wire 30 are physically connected or not, the distance between the end portions 31b of the connecting portions 31 of the adjacent first wires 30 may be such that 0≤Rs/Rc≤0.2 is satisfied, and preferably is twice or less of the distance X that is determined so that the ratio Rs/Rc is 0.2 or less.

Further, the distance between the opposing ends 31c of the adjacent connecting portions 31 of the first wire 30 may be such that 0≤Rs/Rc≤0.2 is satisfied, and is preferably twice or less of the distance X that is determined so that the ratio Rs/Rc is 0.2 or less.

Figure 17:
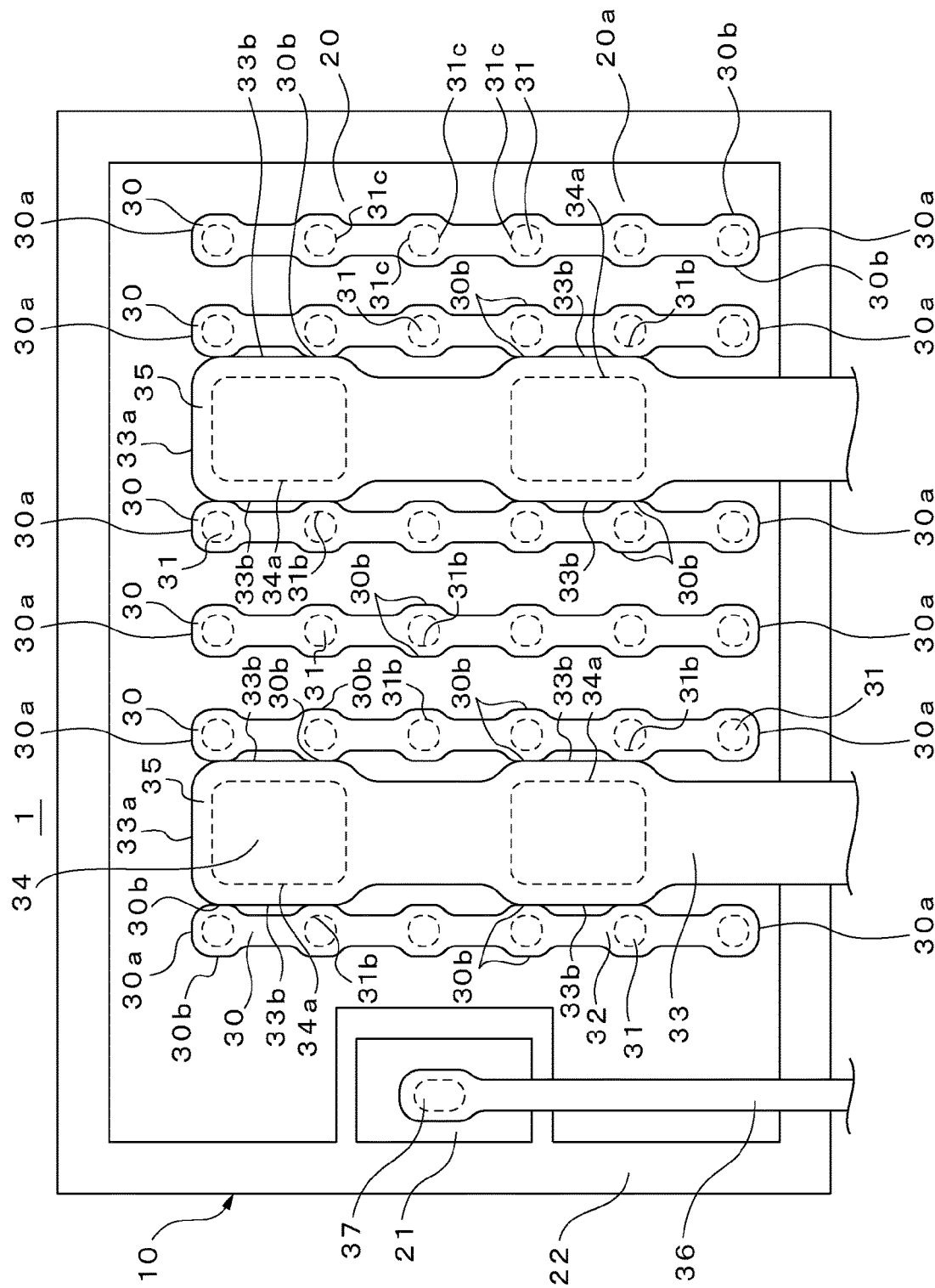
FIG. 17 is a plan view showing a modified example of the semiconductor device of the third embodiment of the present invention.

FIG. 17 is a diagram showing a modified example of the semiconductor device of the third embodiment. In the semiconductor device 1 of this modified example, the direction in which the first wire 30 extends is parallel to the direction in which the second wire 33 extends. Further, the semiconductor device 1 of this modified example has a first wire 30 that is physically in contact with the second wire 33 and a first wire 30 that is not physically in contact with the second wire 33.

For some of the first wires 30, the side surface 30b of the connecting portion 31 of the first wire 30 and the side surface 33b of the connecting portion 34 of the second wire 33 are physically in contact with each other and are electrically connected.

Where the first wire 30 and the second wire 33 are physically connected, the distance between the end portion 31b of the connecting portion 31 of the first wire 30 and the end portion 34a of the connecting portion 33 of the second wire 33 may be such that 0≤Rs/Rc≤0.2 is satisfied and is preferably twice or less of the distance X that is determined so that the ratio Rs/Rc is 0.2 or less.

Further, the distance between the end portions 31b of the connecting portions 31 of the adjacent first wires 30 may be such that 0≤Rs/Rc≤0.2 is satisfied and is preferably twice or less of the distance X that is determined so that the ratio Rs/Rc is 0.2 or less.

Further, the distance between the opposing end portions 31c of adjacent connecting portions 31 of the first wire 30 may be such that 0≤Rs/Rc≤0.2 is satisfied and is preferably twice or less of the distance X that is determined so that the ratio Rs/Rc is 0.2.

Next, an embodiment for a method for manufacturing the semiconductor devices disclosed in the present specification will be described below with reference to FIGS. 18 to 20.

Figure 18:
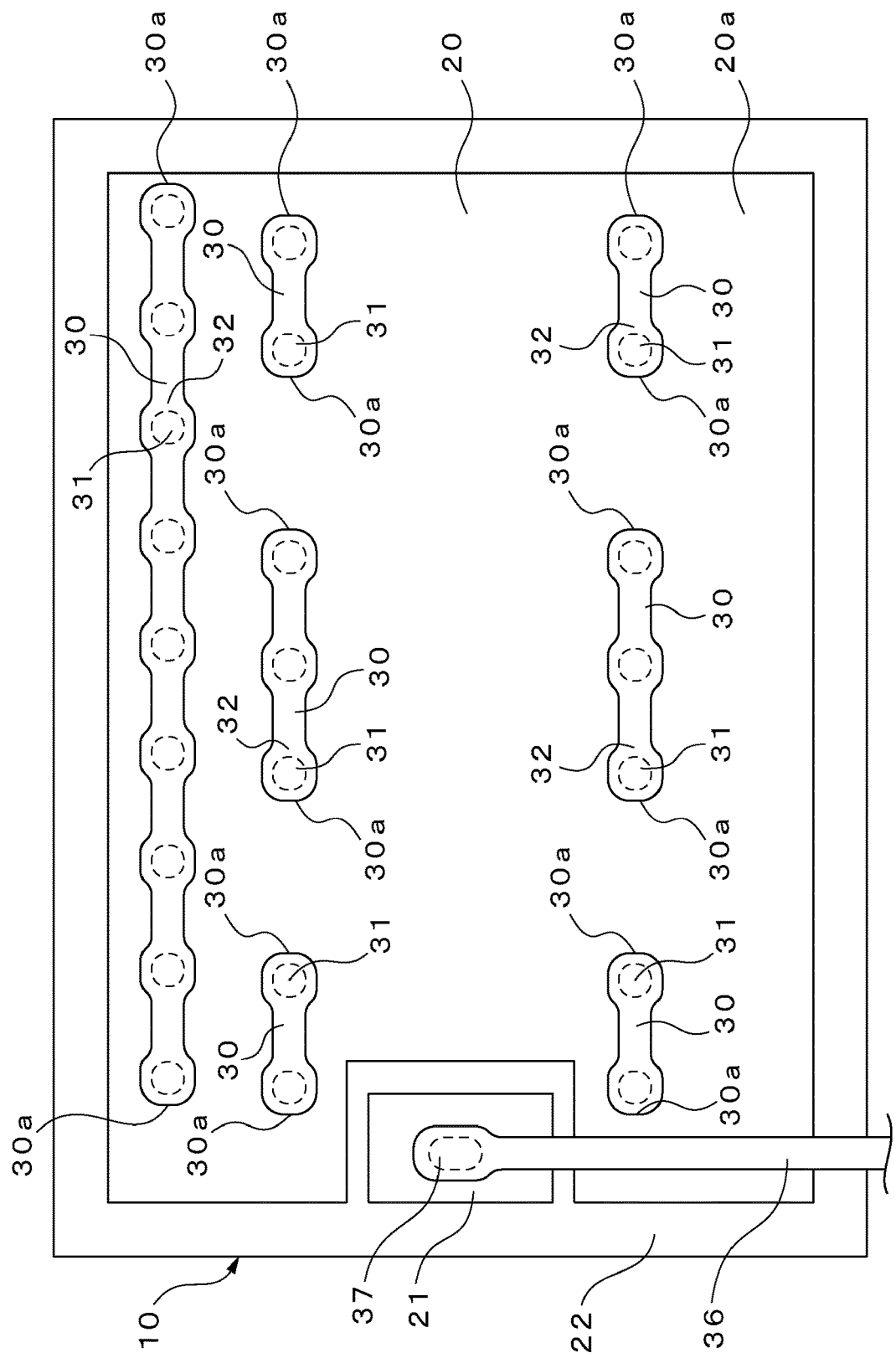
FIG. 18 is a plan view illustrating a process in a method for manufacturing a semiconductor device according to an embodiment of the present invention.

First, as shown in FIG. 18, the first wires 30 having conductivity are formed on the first main surface 20a of the source electrode layer 20 of the semiconductor element 10 so as to be electrically connected to the first main surface 20a of the source electrode layer 20 at a plurality of connecting portions 31 and so as to extend in a predetermined direction.

Specifically, an end of an elongated wire is arranged on the first main surface 20a of the source electrode layer 20, and is joined with the first main surface 20a of the source electrode layer 20 using ultrasonic waves as in wire bonding, for example, so as to form a connecting portion 31.

The wire is then moved in a predetermined direction, and is repeatedly joined with the first main surface 20a of the source electrode layer 20 so as to form a plurality of connecting portions 31.

When the wire connected to the first main surface 20a of the source electrode layer 20 reaches a predetermined length, the wire is cut in the vicinity of the last connecting portion 31 so as to form a first wire 30.

Further, the conductive third wire 36 is arranged on the gate electrode layer 21 so as to be electrically connected to the gate electrode layer 21 at the connecting portion 37. The other end of the third wire 36 is electrically connected to a wiring pattern of a circuit board or an external terminal such as a lead frame (not shown) on which the semiconductor element 10 is mounted.

Figure 19:
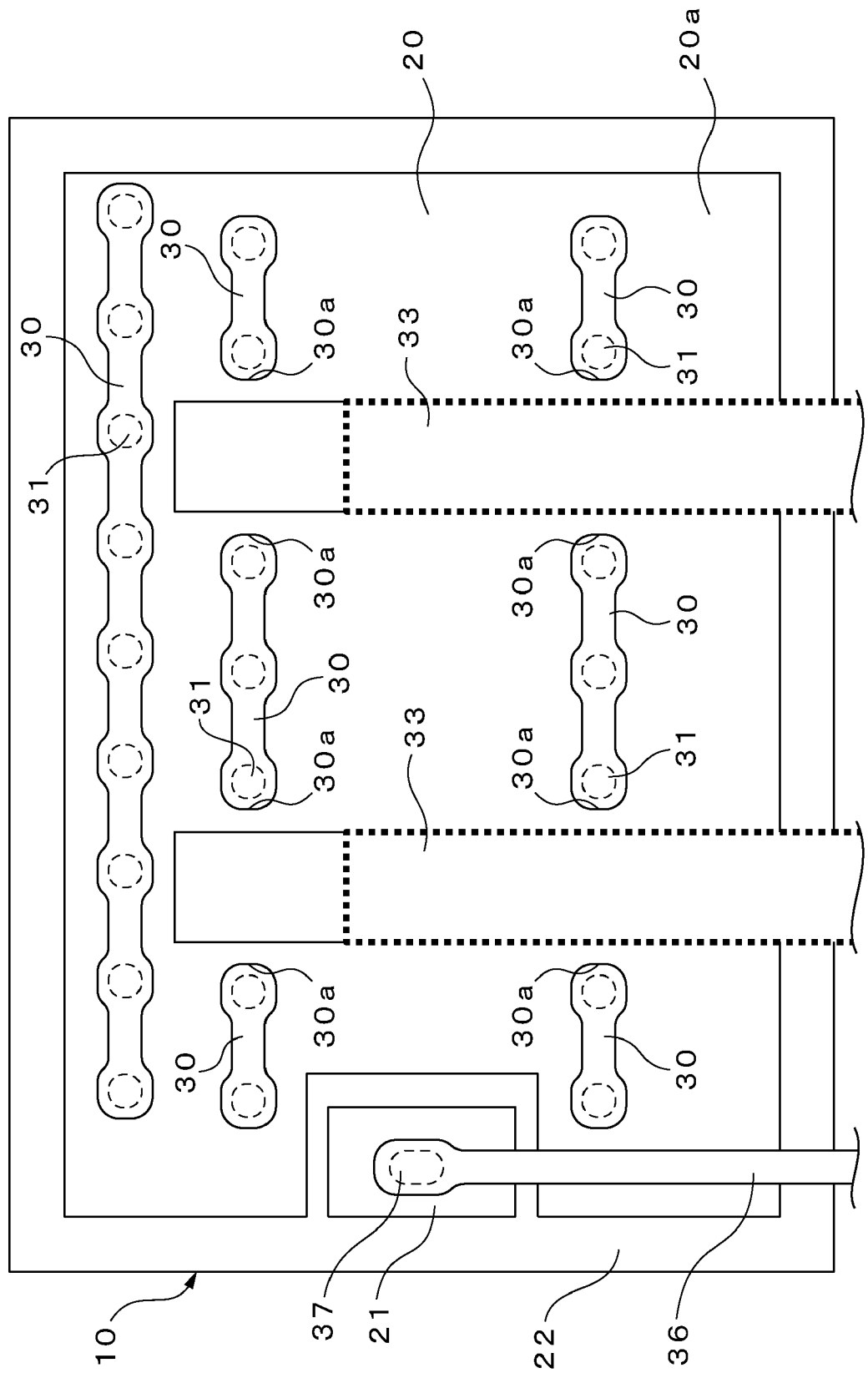
FIG. 19 is a plan view illustrating another process in the method for manufacturing the semiconductor device according to the embodiment of the present invention.

Next, as shown in FIG. 19, the second wire 33, which has conductivity and has a larger circle-equivalent diameter than the first wire 30, is placed on the first main surface 20a of the source electrode layer 20 in a direction that intersects with the extending direction of the first wires 30.

In the example shown in FIG. 19, the second wire 33 is arranged in a direction orthogonal to the direction in which the first wire 30 extends. The dotted line portion of the second wire 33 indicates the direction in which the second wire 33 extends (the direction in which it is moved).

Figure 20:
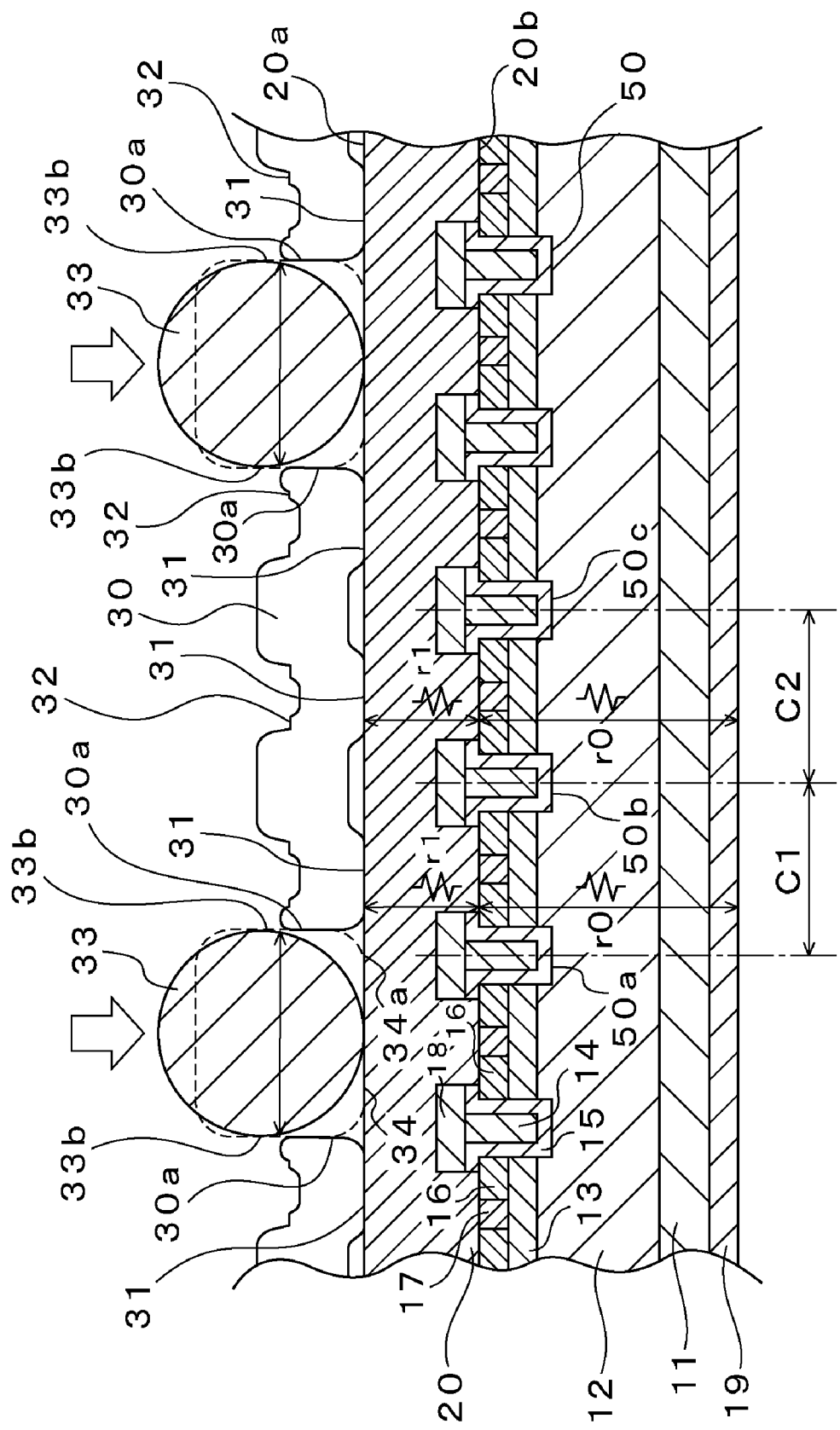
FIG. 20 is a diagram illustrating yet another process in the method for manufacturing the semiconductor device according to the embodiment of the present invention.

Next, as shown in FIG. 20, the connecting portion 34 is formed by joining the second wire 33 with the first main surface 20a of the source electrode layer 20 by using ultrasonic waves, for example, as in wire bonding.

Further, the second wire 33 is moved in the direction in which the second wire 33 extends, and is arranged on the first main surface 20a of the source electrode layer 20. Then another connecting portion 34 is formed by joining the second wire 33 and the first main surface 20a of the source electrode layer 20. Thus, by moving the second wire 33 in a predetermined direction, the second wire 33 is repeatedly joined with the first main surface 20a of the source electrode layer 20 so as to form a plurality of connecting portions 34.

The other end of the second wire 33 is electrically connected to a wiring pattern of a circuit board or an external terminal such as a lead frame (not shown) on which the semiconductor element 10 is mounted. As a result, the end portion 30a of the first wire 30 and the side surface 33b of the connecting portion 34 of the second wire 33 are physically in contact with each other and are also electrically connected. After the first wire 30 is connected to the first main surface 20a of the source electrode layer 20, the second wire 33 having a larger circular equivalent diameter than the first wire 30 is connected to the first main surface 20a of the source electrode layer 20. As a result, the semiconductor device 1 shown in FIGS. 4 to 6 can be obtained.

In the present invention, the semiconductor device of the above-described embodiments and the method for manufacturing the semiconductor device can be appropriately changed as long as the gist of the present invention is not deviated. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

For example, in the above-described embodiments, when the first wire and the second wire are in contact with each other, an end portion of the first wire and a side surface of the connecting portion of the second wire, a side surface of the connecting portion of the first wire and an end portion of the second wire, or a side surface of the connecting portion of the first wire and a side surface of the connecting portion of the second wire were in contact with each other. But the first wire and the second wire may be connected at portions other than the end portions and the side surfaces of each wire. For example, the second wire may be arranged so as to straddle the first wire and come into contact with the first wire.

Further, in some of the above-described embodiments, the first wire and the second wire are arranged so as to intersect at the right angle, but the first wire and the second wire may intersect at an angle different from the right angle.

In the above-described embodiments, the extending directions of the first wire, the second wire, and the third wire and the positions of the gate electrode layer and the source electrode layer of the semiconductor element are defined, but the extending directions of the first wire, the second wire, and the third wire and the positions of the gate electrode layer and the source electrode layer of the semiconductor element may differ from those described above, depending on the wiring pattern of the circuit board of the semiconductor device or the external terminals such as the lead frame on which the semiconductor element is mounted.

In the above-described embodiments, the case where the semiconductor element is a MOSFET (Metal Oxide Semiconductor Field Effect Transistor) is shown, but the present invention is not limited to this, and the semiconductor element may be an IGBT (Insulated Gate Bipolar Transistor) or a reverse conduction type IGBT (RC-IGBT: Reverse Conducting Insulated Gate Bipolar Transistor), for example.

What is claimed is:

1. A semiconductor device, comprising:
   a semiconductor element having a surface electrode layer, the surface electrode layer having a first main surface and a second main surface opposite to the first main surface, the first main surface being an exposed surface;
   a first wire that is electrically connected to the first main surface of the surface electrode layer at a plurality of first connecting portions and is arranged in a first direction on the first main surface; and
   a second wire that is electrically connected to the first main surface of the surface electrode layer at a second connecting portion and is arranged in a second direction on the first main surface,
   wherein a second circle equivalent diameter, which is a diameter of a circle having a same cross-sectional area as the second wire, is larger than a first circle equivalent diameter, which is a diameter of a circle having a same cross-sectional area as the first wire.

2. The semiconductor device according to claim 1, wherein the first circle-equivalent diameter is 4 times or more and 50 times or less a thickness of the surface electrode layer.

3. The semiconductor device according to claim 1, wherein the first direction intersects with the second direction.

4. The semiconductor device according to claim 1, wherein the first direction and the second direction are parallel to each other.

5. The semiconductor device according to claim 1, wherein the first wire and the second wire are in contact with each other.

6. The semiconductor element according to claim 1,
   wherein the first connecting portion of the first wire that is closest to the second connecting portion of the second wire is separated from the second connecting portion by a distance S, and
   wherein a sheet resistance Rs of an annular region of the surface electrode layer that surrounds every side of the first connecting portion that is closest to the second connection portion by the distance S in a plan view satisfies $0 \leq Rs/Rc \leq 0.2$, where Rc is an on-resistance of the semiconductor element corresponding to said annular region as well as the first connecting portion closest to the second connection portion in the plan view.

7. A method for manufacturing a semiconductor device including a semiconductor element having a surface electrode layer, the surface electrode layer having a first main surface and a second main surface opposite to the first main surface, the first main surface being an exposed surface, the method comprising:
- a first step of arranging a first wire having conductivity on the first main surface of the surface electrode layer so as to be electrically connected to the first main surface of the surface electrode layer at a plurality of first connecting portions and so as to be arranged in a first direction; and
- a second step of arranging a second wire having conductivity on the first main surface of the surface electrode layer so as to be electrically connected to the first main surface of the surface electrode layer at a second connecting portion and so as to be arranged in a second direction, the second wire having a larger cross section than the first wire.

8. The method according to claim 7, wherein the second step is performed after the first step.

9. The method according to claim 7, wherein the second direction intersects with the first direction intersect.

10. The method according to claim 7, wherein the second direction and the first direction are parallel to each other.

11. The method according to claim 7, wherein the second step causes the second wire to be in contact with the first wire.

* * * * *